(12) United States Patent
Moon et al.

(10) Patent No.: US 9,418,746 B2
(45) Date of Patent: Aug. 16, 2016

(54) STORAGE DEVICES AND METHODS OF OPERATING STORAGE DEVICES

(71) Applicants: Sangkwon Moon, Osan-si (KR); Seongjun Ahn, Seoul (KR); Heewon Lee, Suwon-si (KR)

(72) Inventors: Sangkwon Moon, Osan-si (KR); Seongjun Ahn, Seoul (KR); Heewon Lee, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/968,495

(22) Filed: Dec. 14, 2015

(65) Prior Publication Data

US 2016/0172046 A1   Jun. 16, 2016

(30) Foreign Application Priority Data

Dec. 15, 2014   (KR) ........................ 10-2014-0180342

(51) Int. Cl.
*G11C 16/16*   (2006.01)
*G11C 16/04*   (2006.01)
*G11C 16/26*   (2006.01)
*G11C 16/32*   (2006.01)

(52) U.S. Cl.
CPC ............ *G11C 16/16* (2013.01); *G11C 16/0483* (2013.01); *G11C 16/26* (2013.01); *G11C 16/32* (2013.01)

(58) Field of Classification Search
CPC .... G11C 16/16; G11C 16/32; G11C 16/0483; G11C 16/26
See application file for complete search history.

(56) References Cited

U.S. PATENT DOCUMENTS

| 5,361,235 | A | * | 11/1994 | Kodama | ................ | G11C 16/14 |
|---|---|---|---|---|---|---|
| | | | | | | 365/185.09 |
| 7,196,928 | B2 | | 3/2007 | Chen | | |
| 7,679,133 | B2 | | 3/2010 | Son et al. | | |
| 7,813,181 | B2 | | 10/2010 | Cernea | | |
| 8,107,297 | B2 | | 1/2012 | Baek et al. | | |
| 8,516,183 | B2 | | 8/2013 | Eun et al. | | |
| 8,553,466 | B2 | | 10/2013 | Han et al. | | |
| 8,559,235 | B2 | | 10/2013 | Yoon et al. | | |
| 8,654,587 | B2 | | 2/2014 | Yoon et al. | | |
| 8,806,108 | B2 | | 8/2014 | Suzuki et al. | | |
| 2008/0279005 | A1 | * | 11/2008 | France | ................ | G06F 12/0246 |
| | | | | | | 365/185.11 |
| 2011/0233648 | A1 | | 9/2011 | Seol et al. | | |
| 2012/0020155 | A1 | | 1/2012 | Kim | | |
| 2012/0268994 | A1 | | 10/2012 | Nagashima | | |
| 2014/0229131 | A1 | | 8/2014 | Cohen et al. | | |

FOREIGN PATENT DOCUMENTS

| JP | 08-147988 | 6/1996 |
|---|---|---|
| JP | 09-320289 | 12/1997 |

* cited by examiner

*Primary Examiner* — Douglas King
(74) *Attorney, Agent, or Firm* — Volentine & Whitt, PLLC

(57) ABSTRACT

A storage device includes a nonvolatile memory having a plurality of memory cells and a memory controller to control the nonvolatile memory. The operating method of the storage device includes reading previously programmed memory cells among the memory cells of the nonvolatile memory and determining a time after erase of the previously programmed memory cells, programming selected memory cells of the nonvolatile memory, and programming meta data including a time after erase of the selected memory cells, based on the determined time after erase of the previously programmed memory cells.

20 Claims, 26 Drawing Sheets

FIG. 13

| WL | Meta data | Status |
|---|---|---|
| WL6 | | Unprogrammed |
| WL5 | TI4 | Programmed |
| WL4 | TI3 | Programmed |
| WL3 | TI2 | Programmed |
| WL2 | TI1 | Programmed |
| WL1 | | Programmed |

FIG. 15

| WL | Meta data | | Status |
|---|---|---|---|
| WL6 | | | Unprogrammed |
| WL5 | TI4 | | Programmed |
| WL4 | TI3 | | Programmed |
| WL3 | TI2 | | Programmed |
| WL2 | TI1 | | Programmed |
| WL1 | | TEMP | Programmed |

FIG. 20

| WL | Meta data | Status |
|---|---|---|
| DWL2 | | Programmed (Dummy data) |
| WL6 | | Unprogrammed |
| WL5 | TI5 | Programmed |
| WL4 | TI4 | Programmed |
| WL3 | TI3 | Programmed |
| WL2 | TI2 | Programmed |
| WL1 | TI1 | Programmed |
| DWL1 | | Programmed (Dummy data) |

FIG. 21

| WL | Meta data | | Status |
|---|---|---|---|
| DWL2 | | TEMP | Programmed (Dummy data) |
| WL6 | | | Unprogrammed |
| WL5 | TI5 | | Programmed |
| WL4 | TI4 | | Programmed |
| WL3 | TI3 | | Programmed |
| WL2 | TI2 | | Programmed |
| WL1 | TI1 | | Programmed |
| DWL1 | | TEMP | Programmed (Dummy data) |

STORAGE DEVICES AND METHODS OF OPERATING STORAGE DEVICES

CROSS-REFERENCE TO RELATED APPLICATIONS

A claim for priority under 35 U.S.C. §119 is made to Korean Patent Application No. 10-2014-0180342 filed Dec. 15, 2014, in the Korean Intellectual Property Office, the entire contents of which are hereby incorporated by reference.

BACKGROUND

Embodiments of the inventive concepts described herein relate to semiconductor memories, and more particularly, to storage devices and methods of operating storage devices.

A storage device is a device that stores data under control of a host device, such as a computer, a smart phone, and a smart pad. The storage device typically contains either a magnetic disk memory (e.g., Hard Disk Drive) for storing data, or a semiconductor memory (e.g., Solid State Drive or memory card) for storing data. In either case, the memory may be nonvolatile in that stored data is retained even in the absence of supplied power.

Examples of nonvolatile semiconductor memory include ROM (Read Only Memory), PROM (Programmable ROM), EPROM (Electrically Programmable ROM), EEPROM (Electrically Erasable and Programmable ROM), flash memory, PRAM (Phase-change RAM), MRAM (Magnetic RAM), RRAM (Resistive RAM), or FRAM (Ferroelectric RAM).

With advancements in semiconductor fabrication technology allowing for reductions in scale, the integration degree and memory capacity of storage devices continue to increase, thus pushing costs downward. However, the scaling down of device components in this manner creates numerous roadblocks to maintaining device reliability.

SUMMARY

One aspect of embodiments of the inventive concept is directed to provide an operating method of a storage device which includes a nonvolatile memory having a plurality of memory cells and a memory controller to control the nonvolatile memory, the operating method including reading previously programmed memory cells among the memory cells of the nonvolatile memory and determining a time after erase of the previously programmed memory cells; programming selected memory cells of the nonvolatile memory; and programming meta data indicative of a time after erase of the selected memory cells, based on the determined time after erase of the previously programmed memory cells.

The determining of a time after erase may include detecting an open memory block including the selected memory cells; and reading first programmed memory cells of the open memory block to determine the time after erase.

The detecting of an open memory block and the reading of first programmed memory cells may be performed immediately after detecting a power-on state of the storage device.

The detecting of an open memory block and the reading of first programmed memory cells may be performed after detection of a power-on state and during an idle state of the storage device.

The operating method may further include restoring a time passing after erasing the open memory block, based on the determined time after erase and a time counter of the storage device.

A time of the open memory block when the selected memory block is programmed may be programmed as the meta data of the selected memory block.

The reading of first programmed memory cells may include performing a read operation with respect to at least one of program states of the first programmed memory cells; counting a number of memory cells turned on and a number of memory cells turned off when the read operation is performed; and determining the time after erase according to the count result.

A method for determining the time after erase may be variable according to whether memory cells immediately adjacent to the first programmed memory cells are programmed.

The reading of first programmed memory cells may include iteratively performing a read operation with respect to at least one of program states of the first programmed memory cells; detecting a threshold voltage variation of the at least one program state according to results of the iteratively performed read operations; and determining the time after erase according to the detection result.

The operating method may further include receiving a write request; and determining whether an open memory block including memory cells before programming exists. When the open memory block exists, the calculating of a time after erase and the programming of meta data may be performed according to the write request. When the open memory block does not exist, erasing of an invalid memory block and programming of memory cells of the erased memory block may be performed according to the write request.

A compensation of the time after erase may be made according to a difference between a temperature when the previously programmed memory cells are programmed and a temperature when the previously programmed memory cells are read.

The operating method may further include receiving a read request on the selected memory cells; reading the meta data of the selected memory cells; adjusting a read voltage according to the meta data; and reading the selected memory cells using the adjusted read voltage.

The previously programmed memory cells may be dummy memory cells.

The operating method may further include erasing a memory block including the dummy memory cells; and programming the dummy memory cells to a dummy program state, immediately after the memory block is erased.

The determining of a time after erase may be performed in response to a write request.

The determining of a time after erase may include reading meta data of most recently programmed memory cells from an open memory block including the selected memory cells; reading the most recently programmed memory cells and determining a time after program of the most recently programmed memory cells; and determining the time after erase based on the read meta data and the determined time after program.

Another aspect of embodiments of the inventive concept is directed to provide a storage device which includes a nonvolatile memory and a memory controller. The nonvolatile memory includes a plurality of memory cells. The memory controller is configured to control the nonvolatile memory. The memory controller is further configured to read previously programmed memory cells of the memory cells of the nonvolatile memory to detect a time after erase of the previously programmed memory cells; program selected memory cells among the memory cells of the nonvolatile memory; and program the time after erase of the selected memory cells at the nonvolatile memory based on the time after erase of the previously programmed memory cells.

The previously programmed memory cells may be first programmed memory cells of a memory block that includes the previously programmed memory cells and the selected memory cells.

The memory cells may be divided into a plurality of strings. The strings may be arranged on a substrate in rows and columns. Each of the strings may include at least one ground selection transistor, two or more of the memory cells, and at least one string selection transistor sequentially stacked in a direction perpendicular to the substrate.

The nonvolatile memory may include a three-dimensional memory array including the plurality of memory cells.

BRIEF DESCRIPTION OF THE FIGURES

The above and other objects and features will become apparent from the detailed description that follows herein with reference to the accompanying figures, wherein like reference numerals refer to like parts throughout the various figures unless otherwise specified, and wherein:

FIG. 13 is a table exemplarily showing meta data managed according to an exemplary embodiment of the inventive concept;

FIG. 15 is a table showing meta data including temperature information, according to an exemplary embodiment of the inventive concept;

FIG. 20 is a table showing meta data of a memory block including dummy memory cells, according to an exemplary embodiment of the inventive concept;

FIG. 21 is a table showing meta data of a memory block including dummy memory cells, according to another exemplary embodiment of the inventive concept;

DETAILED DESCRIPTION

Figure 1:
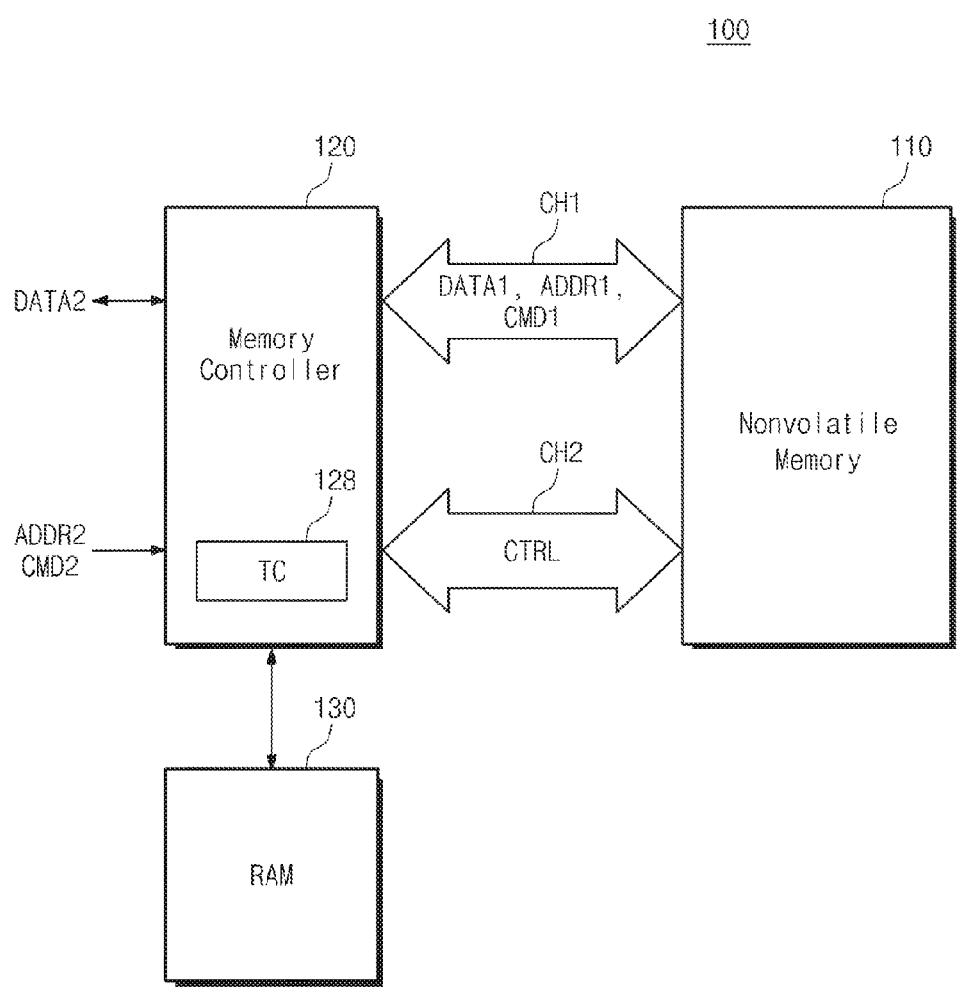
FIG. 1 is a block diagram schematically illustrating a storage device according to an exemplary embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a storage device 100 according to an exemplary embodiment of the inventive concept. Referring to FIG. 1, a storage device 100 contains a nonvolatile memory 110, a memory controller 120, and a RAM 130.

The nonvolatile memory 110 performs read, write, and erase operations under control of the memory controller 120. The nonvolatile memory 110 exchanges first data DATA1 with the memory controller 120. For example, in the case of a write operation, the nonvolatile memory 110 receives the DATA1 as write data from the memory controller 120 and stores the write data. On the other hand, in the case of a read operation, the nonvolatile memory 110 retrieves and outputs the first data DATA1 as read data to the memory controller 120.

The nonvolatile memory 110 also receives a first command CMD1 and a first address ADDR1 from the memory controller 120, and exchanges a control signal CTRL with the memory controller 120. For example, the control signal CTRL received by nonvolatile memory 110 from the memory controller 120 may include at least one of a chip enable signal /CE for selecting at least one of a plurality of semiconductor chips constituting the nonvolatile memory 110, a command latch enable signal CLE indicating that a signal received from the memory controller 120 is the first command CMD1, an address latch enable signal ALE indicating that a signal received from the memory controller 120 is the first address ADDR1, a read enable signal /RE that the memory controller 120 generates at a read operation, is periodically toggled, and is used to tune timing, a write enable signal /WE activated by the memory controller 120 when the first command CMD1 or the first address ADDR1 is transmitted, a write protection signal /WP activated by the memory controller 120 to prevent unintended writing or erasing when a power changes, and a data strobe signal DQS that the memory controller 120 generates a write operation, is periodically toggled, and is used to adjust input synchronization of the first data DATA1. For example, the control signal CTRL received by the memory controller 120 from the nonvolatile memory 110 may include at least one of at least one of a ready/busy signal R/nB indicating whether the nonvolatile memory 110 is performing a program, erase or read operation and a data strobe signal DQS that the nonvolatile memory 110 generates based on the read enable signal /RE, is periodically toggled, and is used to adjust output synchronization of the first data DATA1.

In exemplary embodiments, the first data DATA1, the first address ADDR1, and the first command CMD1 may be exchanged between the memory controller 120 and the nonvolatile memory 110 through a first channel CH1. The control signal CTRL may be exchanged between the memory controller 120 and the nonvolatile memory 110 through a second channel CH2. The second channel CH2 may be a control channel.

The nonvolatile memory 110 may include a flash memory. However, the scope and spirit of the inventive concept is not be limited thereto. For example, the nonvolatile memory 110 may incorporate at least one of other types of nonvolatile memories, such as PRAM (Phase-change RAM), MRAM (Magnetic RAM), RRAM (Resistive RAM), and FeRAM (Ferroelectric RAM).

The memory controller 120 is configured to control the nonvolatile memory 110. For example, the nonvolatile memory 110 performs a write, read, or erase operation under control of the memory controller 120. The memory controller 120 exchanges the first data DATA1 and the control signal CTRL with the nonvolatile memory 110, and outputs the first command CMD1 and the first address ADDR1 to the nonvolatile memory 110.

The memory controller 120 controls the nonvolatile memory 110 under control of an external host device (not shown). The memory controller 120 exchanges second data DATA2 with the host device and receives a second command CMD2 and a second address ADDR2 therefrom.

In exemplary embodiments, the memory controller 120 exchanges the first data DATA1 with the nonvolatile memory 110 by a first unit (e.g., time unit or data unit), and it exchanges the second data DATA2 with the host device by a second unit (e.g., time unit or data unit) which is different from the first unit.

Based on a first format, the memory controller 120 exchanges the first data DATA1 with the nonvolatile memory 110 and transmits the first command CMD1 and the first address ADDR1 to the nonvolatile memory 110. Based on a second format which is different from the first format, the memory controller 120 exchanges the second data DATA2 with the host device and receives the second command CMD2 and the second address ADDR2 from the host device.

The memory controller 120 uses the RAM 130 as a working memory, a buffer memory, and/or a cache memory. For example, the memory controller 120 receives the second data DATA2 from the host device and stores the second data DATA2 in the RAM 130. The memory controller 120 writes the second data DATA2 stored in the RAM 130 at the nonvolatile memory 110 as the first data DATA1. The memory controller 120 reads the first data DATA1 from the nonvolatile memory 110 and stores the first data DATA1 thus read in the RAM 130. The memory controller 120 outputs the first data DATA1 stored in the RAM 130 to the host device as the second data DATA2. The memory controller 120 stores data read from the nonvolatile memory 110 at the RAM 130 and writes the data stored in the RAM 130 back at the nonvolatile memory 110.

The memory controller 120 stores data or code, which is needed to manage the nonvolatile memory 110, at the RAM 130. For example, the memory controller 120 reads data or code, which is needed to manage the nonvolatile memory 110, from the nonvolatile memory 110 and loads the read data or code on the RAM 130 for driving operations.

The memory controller 120 contains a time calculator 128. The time calculator 128 calculates a local time or a global time of the storage device 100. The local time may be a time that passes in the storage device 100. For example, the time calculator 128 calculates a time based on a clock from an external host device or an internal clock while a power is supplied to the storage device 100. When supplying of the power to the storage device 100 is interrupted and resumed, the time calculator 128 calculates the local time based on internal information of the storage device 100. For example, the time calculator 128 restores the local time according to a time elapsed while supplying of the power to the storage device 100 is interrupted.

The global time is a time that passes at a system including the storage device 100. For example, the time calculator 128 calculates the local time of the storage device 100. The local time may be synchronized with a time of the external host device. The synchronized time may be the global time. The global time may be, for example, a real time.

The time calculator 128 may further calculate a time difference. For example, the time calculator 128 may calculate a difference between a first time and a second time.

The RAM 130 may include at least one of a variety of random access memories, such as, but not limited to, a static RAM, a dynamic RAM, a synchronous DRAM (SRAM), a Phase-change RAM (PRAM), a Magnetic RAM (MRAM), a Resistive RAM (RRAM), and a Ferroelectric RAM (FRAM).

The storage device 100 performs address mapping to reduce overhead associated with an erase operation of the nonvolatile memory 110. For example, when overwriting is requested from the external host device, the storage device 100 does not erase memory cells, at which old data is stored, to store overwrite-requested data at erased memory cells, but instead it stores the overwrite-requested data at memory cells of a free storage space. The memory controller 120 drives a flash translation layer (FTL) that is used to map logical addresses for the external host device onto physical addresses for the nonvolatile memory 110 according to the above-described method. For example, the second address ADDR2 may be a logical address, and the first address ADDR1 may be a physical address.

The storage device 100 performs an operation of writing, reading or erasing data according to a request of the host device. The storage device 100 may include a solid state drive (SSD) or a hard disk drive (HDD). The storage device 100 may include the following memory cards: PC card (PCM-CIA, personal computer memory card international association), compact flash card, smart media card (SM, SMC), memory stick, multimedia card (MMC, RS-MMC, MMCmicro), SD card (SD, miniSD, microSD, SDHC), USB (Universal Serial Bus) memory card, and universal flash storage (UFS). The storage device 100 may include the following embedded memories: eMMC (embedded MultiMedia Card), UFS, and PPN (Perfect Page New).

Figure 2:
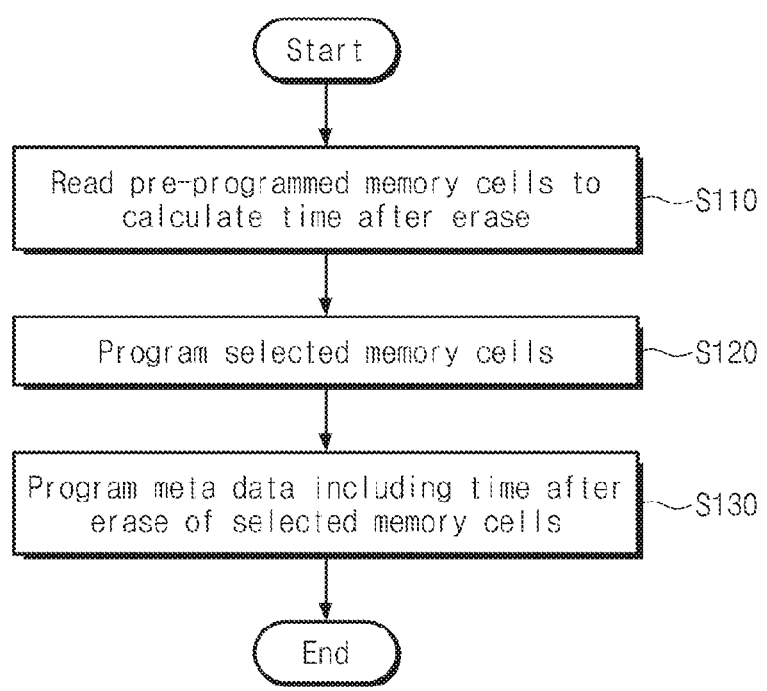
FIG. 2 is a flow chart showing an operating method of a storage device according to an exemplary embodiment of the inventive concept.

FIG. 2 is a flow chart showing an operating method of a storage device 100 according to an exemplary embodiment of the inventive concept. Referring to FIGS. 1 and 2, in step S110, a memory controller 120 reads previously programmed memory cells of memory cells of a nonvolatile memory 110 and calculates a "time after erase". Herein, the "time after erase" correspond to the time elapsed between a memory cell being erased and the same memory cell being programmed. For example, the time calculator 128 may calculate a time that elapses after previously programmed memory cells are erased, based on a result of reading the previously programmed memory cells.

In step S120, the memory controller 120 programs memory cells selected from the memory cells of the nonvolatile memory 110. For example, the selected memory cells may be memory cells that are erased at the same time with the previously programmed memory cells.

In step S130, the memory controller 120 programs the time after erase on the selected memory cells at the nonvolatile memory 110 as meta data of the selected memory cells. For example, the time calculator 128 calculates the time after erase on the selected memory cells, based on a time after erase on the previously programmed memory cells. The time after erase on the selected memory cells may be programmed at spare memory cells corresponding to the selected memory cells. For example, the spare memory cells may belong to a program (or, read) unit and an erase unit which is the same as that of the selected memory cells and may be programmed at the same time with the selected memory cells. The time after erase on the selected memory cells may be programmed at meta memory cells corresponding to the selected memory cells. For example, the meta memory cells may belong to a program (or, read) unit and an erase unit which is different from that of the selected memory cells and may be programmed at timing which different from the selected memory cells.

That is, times from a point in time when memory cells are erased to a point in time when memory cells are programmed may be programmed at spare or meta memory cells as meta information. In this manner, times after erase from a point in time when memory cells are erased until a point in time when they are programmed may be managed.

A problem may occur as a time during which memory cells of the nonvolatile memory 110 are left without programming after being erased increases. That is, the reliability of the memory cells is lowered. In accordance with an exemplary embodiment of the inventive concept, since times after erase on memory cells are managed, it is possible to predict that the reliability of memory cells is lowered due to extended periods of time in which erased memory cells are not programmed. A variety of compensation algorithms to which the reliability on memory cells of the storage device 100 is applied may be adopted, thereby improving the reliability of the storage device 100.

Figure 3:
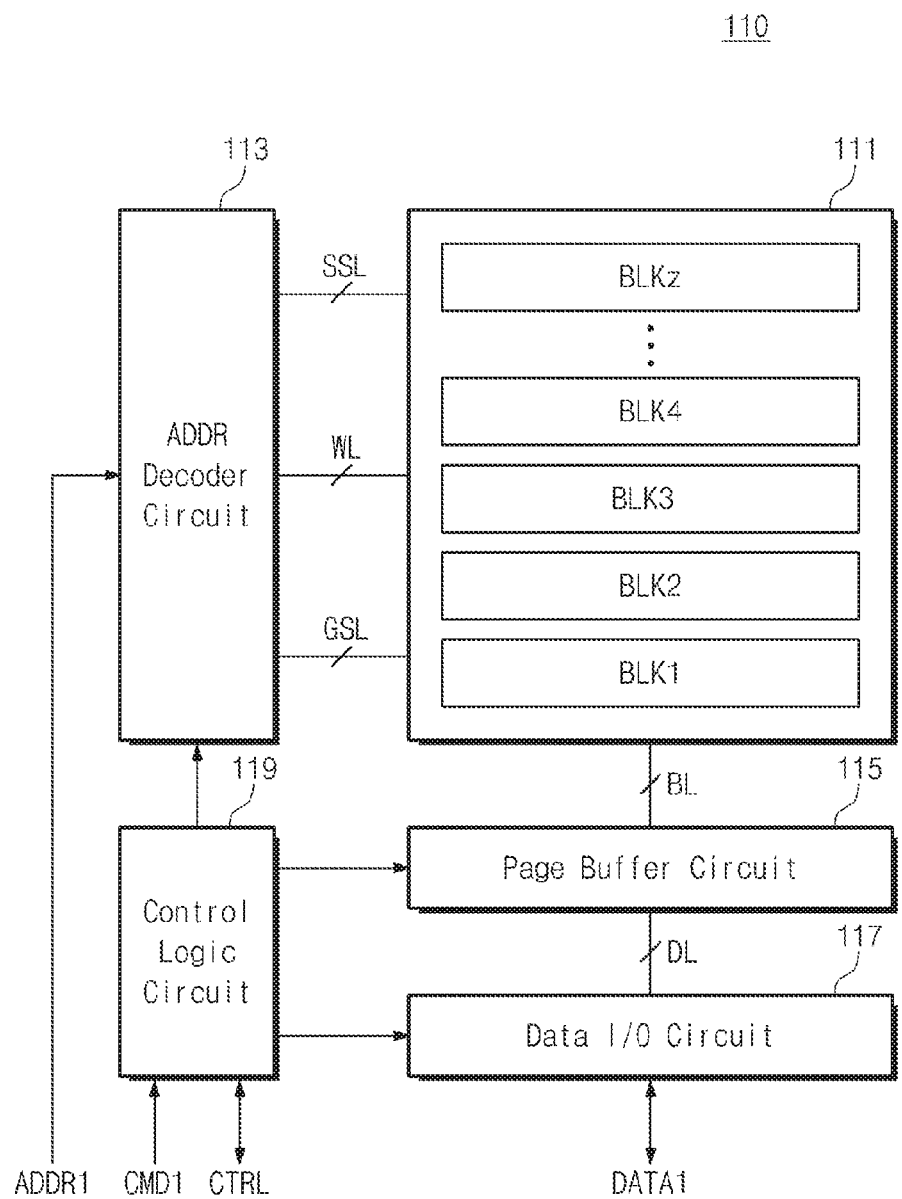
FIG. 3 is a block diagram schematically illustrating a nonvolatile memory according to an exemplary embodiment of the inventive concept.

FIG. 3 is a block diagram schematically illustrating a nonvolatile memory 110 according to an exemplary embodiment of the inventive concept. Referring to FIGS. 1 and 3, a nonvolatile memory 110 includes a memory cell array 111, an address decoder circuit 113, a page buffer circuit 115, a data input/output circuit 117, and a control logic circuit 119.

The memory cell array 111 includes a plurality of memory blocks BLK1 through BLKz, each of which has a plurality of memory cells. Each memory block is connected to the address decoder circuit 113 through at least one string selection line SSL, a plurality of word lines WL, and at least one ground selection line GSL. Each memory block is connected to the page buffer circuit 115 through a plurality of bit lines BL. The memory blocks BLK1 through BLKz may be connected in common to the plurality of bit lines BL. Memory cells of the memory blocks BLK1 through BLKz may have the same structure. In exemplary embodiments, each of the memory blocks BLK1 through BLKz may be an erase unit. An erase operation may be carried out by the memory block. Memory cells of a memory block may be erased at the same time. In other exemplary embodiments, each sub block may be an erase unit.

The address decoder circuit 113 is connected to the memory cell array 111 through a plurality of ground selection lines GSL, the plurality of word lines WL, and a plurality of string selection lines SSL. The address decoder circuit 113 operates in response to a control of the control logic circuit 119. The address decoder circuit 113 receives a first address ADDR1 from a memory controller 120. The address decoder circuit 113 decodes the first address ADDR1 and controls voltages to be applied to the word lines WL depending on the decoded address.

For example, at programming, the address decoder circuit 113 applies a program voltage to a selected word line of a selected memory block that the first address ADDR1 points to. The address decoder circuit 113 also applies a pass voltage to unselected word lines of the selected memory block. At reading, the address decoder circuit 113 applies a selection read voltage to a selected word line of a selected memory block that the first address ADDR1 points to. The address decoder circuit 113 also applies a non-selection read voltage to unselected word lines of the selected memory block. At erasing, the address decoder circuit 113 applies an erase voltage (e.g., ground voltage) to word lines of a selected memory block that the first address ADDR1 points to.

The page buffer circuit 115 is connected to the memory cell array 111 through the bit lines BL. The page buffer circuit 115 is connected to the data input/output circuit 117 through a plurality of data lines DL. The page buffer circuit 115 operates in response to a control of the control logic circuit 119.

The page buffer circuit 115 holds data to be programmed at memory cells of the memory cell array 111 or data read from memory cells thereof. During a program operation, the page buffer circuit 115 stores data to be stored in memory cells. The page buffer circuit 115 biases the plurality of bit lines BL based on the stored data. The page buffer circuit 115 serves as a write driver at a program operation. During a read operation, the page buffer circuit 115 senses voltages of the bit lines BL and stores the sensed results. The page buffer circuit 115 serves as a sense amplifier at a read operation.

The data input/output circuit 117 is connected to the page buffer circuit 115 through the data lines DL. The data input/output circuit 117 exchanges first data DATA1 with the memory controller 120.

The data input/output circuit 117 temporarily stores first data DATA1 that the memory controller 120 provides, and it transfers the temporarily stored data to the page buffer circuit 115. The data input/output circuit 117 temporarily stores data transferred from the page buffer circuit 115 and transfers it to the memory controller 120. The data input/output circuit 117 serves as a buffer memory.

The control logic circuit 119 receives a first command CMD1 and a control signal CTRL from the memory controller 120. The control logic circuit 119 decodes the first command CMD1 thus received and controls an overall operation of the nonvolatile memory 110 according to the decoded command.

In exemplary embodiments, during a read operation, the control logic circuit 119 may generate a data strobe signal DQS depending on a read enable signal /RE of the received control signal CTRL. During a write operation, the control logic circuit 119 may generate a data strobe signal DQS depending on a data strobe signal DQS of the received control signal CTRL.

Figure 4:
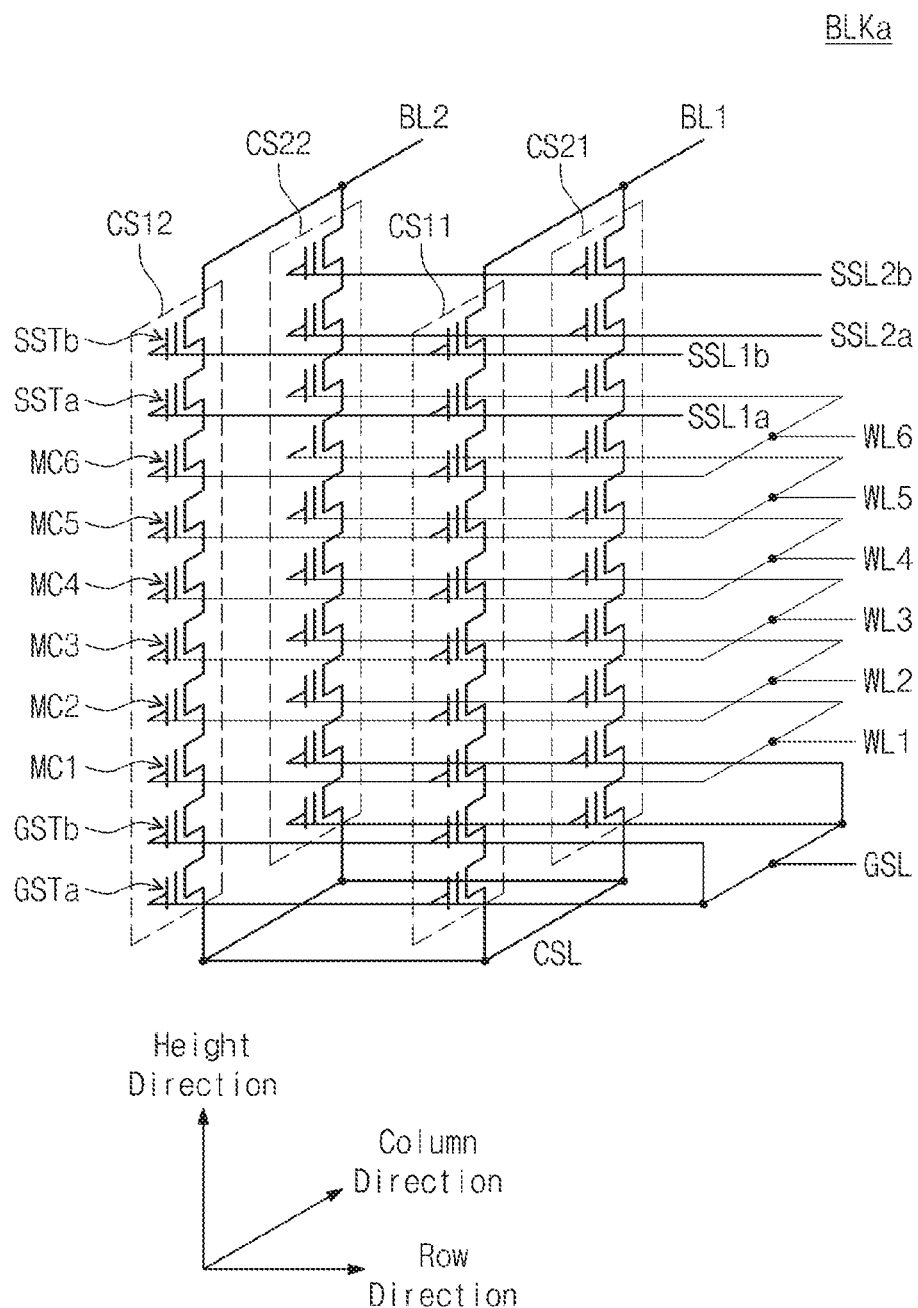
FIG. 4 is a circuit diagram schematically illustrating a memory block according to an exemplary embodiment of the inventive concept.

FIG. 4 is a circuit diagram schematically illustrating a memory block BLKa according to an exemplary embodiment of the inventive concept. Referring to FIG. 4, a memory block BLKa includes a plurality of cell strings CS11 through CS21 and CS12 through CS22. The plurality of cell strings CS11 through CS21 and CS12 through CS22 are arranged along a row direction and a column direction and form rows and columns.

For example, the cell strings CS11 and CS12 arranged along the row direction form a first row, and the cell strings CS21 and CS22 arranged along the row direction form a second row. The cell strings CS11 and CS21 arranged along the column direction form a first column, and the cell strings CS12 and CS22 arranged along the column direction form a second column.

Each cell string contains a plurality of cell transistors. The cell transistors include ground selection transistors GSTa and GSTb, memory cells MC1 through MC6, and string selection transistors SSTa and SSTb. The ground selection transistors GSTa and GSTb, memory cells MC1 through MC6, and string selection transistors SSTa and SSTb of each cell string are stacked in a height direction perpendicular to a plane (e.g., plane above a substrate of the memory block BLKa) on which the cell strings CS11 through CS21 and CS12 through CS22 are arranged along rows and columns.

Each cell transistor may be formed of a charge trap type cell transistor of which the threshold voltage varies with the amount of charge trapped in its insulation layer.

Lowermost ground selection transistors GSTa are connected in common to a common source line CSL.

The ground selection transistors GSTa and GSTb of the plurality of cell strings CS11 through CS21 and CS12 through CS22 are connected in common to a ground selection line GSL.

In exemplary embodiments, ground selection transistors with the same height (or, order) may be connected to the same ground selection line, and ground selection transistors with different heights (or, orders) may be connected to different ground selection lines. For example, the ground selection transistors GSTa with a first height are connected in common to a first ground selection line, and the ground selection transistors GSTb with a second height are connected in common to a second ground selection line.

In exemplary embodiments, ground selection transistors in the same row may be connected to the same ground selection line, and ground selection transistors in different rows may be connected to different ground selection lines. For example, the ground selection transistors GSTa and GSTb of the cell strings CS11 and CS12 in the first row are connected in common to the first ground selection line and the ground selection transistors GSTa and GSTb of the cell strings CS21 and CS22 in the second row are connected in common to the second ground selection line.

Connected in common to a word line are memory cells that are placed at the same height (or, order) from the substrate (or, the ground selection transistors GST). Connected to different word lines WL1 through WL6 are memory cells that are placed at different heights (or, orders). For example, the memory cells MC1 are connected in common to the word line WL1, the memory cells MC2 are connected in common to the word line WL2, and the memory cells MC3 are connected in common to the word line WL3. The memory cells MC4 are connected in common to the word line WL4, the memory cells MC5 are connected in common to the word line WL5, and the memory cells MC6 are connected in common to the word line WL6.

In first string selection transistors SSTa, having the same height (or, order), of the cell strings CS11 through CS21 and CS12 through CS22, the first string selection transistors SSTa in different rows are connected to different string selection lines SSL1a and SSL2a. For example, the first string selection transistors SSTa of the cell strings CS11 and CS12 are connected in common to the string selection line SSL1a, and the first string selection transistors SSTa of the cell strings CS21 and CS22 are connected in common to the string selection line SSL2a.

In second string selection transistors SSTb, having the same height (or, order), of the cell strings CS11 through CS21 and CS12 through CS22, the second string selection transistors SSTb in different rows are connected to the different string selection lines SSL1a and SSL2a. For example, the second string selection transistors SSTb of the cell strings CS11 and CS12 are connected in common to the string selection line SSL1b, and the second string selection transistors SSTb of the cell strings CS21 and CS22 are connected in common to the string selection line SSL2b.

That is, cell strings in different rows may be connected to different string selection lines. String selection transistors, having the same height (or, order), of cell strings in the same row may be connected to the same string selection line. String selection transistors, having different heights (or, orders), of cell strings in the same row may be connected to different string selection lines.

In exemplary embodiments, string selection transistors of cell strings in the same row may be connected in common to a string selection line. For example, string selection transistors SSTa and SSTb of cell strings CS11 and CS12 in the first row are connected in common to a string selection line, and string selection transistors SSTa and SSTb of cell strings CS21 and CS22 in the second row are connected in common to a string selection line.

Columns of the cell strings CS11 through CS21 and CS12 through CS22 are connected to different bit lines BL1 and BL2, respectively. For example, string selection transistors SSTb of the cell strings CS11 and CS21 in the first column are connected in common to the bit line BL1, and string selection transistors SSTb of the cell strings CS12 and CS22 in the second column are connected in common to the bit line BL2.

The cell strings CS11 and CS12 form a first plane, and the cell strings CS21 and CS22 form a second plane.

A write and a read operation of the memory block BLKa may be performed by the row. For example, one plane is selected by the string selection lines SSL1a, SSL1b, SSL2a, and SSL2b. Connected to the bit lines BL1 and BL2 are cell strings CS11 and CS12 of the first plane when a turn-on voltage is applied to the string selection lines SSL1a and SSL1b and a turn-off voltage is supplied to the string selection lines SSL2a and SSL2b. That is, the first plane is selected. Connected to the bit lines BL1 and BL2 are cell strings CS21 and CS22 of the second plane when a turn-on voltage is applied to the string selection lines SSL2a and SSL2b and a turn-off voltage is supplied to the string selection lines SSL1a and SSL1b. That is, the second plane is selected. In a selected plane, a row of memory cells may be selected by word lines WL1 to WL6. A read or a write operation may be performed with respect to the selected row.

An erase operation on the memory block BLKa may be performed by the block or by the sub block. All of memory cells of a memory block BLKa may be erased when the erase operation is performed by the memory block. The erase operation being performed by the sub block, a part of memory cells of the memory block BLKa may be erased, and the rest thereof may be erase-inhibited. A low voltage (e.g., ground voltage) is supplied to a word line connected to memory cells to be erased, and a word line connected to memory cells to be erase-inhibited is floated.

The memory block BLKa shown in FIG. 4 is exemplary, and the scope and spirit of the inventive concept is not limited thereto. For example, the number of rows of cell strings may increase or decrease relative to that shown in FIG. 4. If the number of rows of cell strings is changed, the number of string or ground selection lines and the number of cell strings connected to a bit line may also be changed.

The number of columns of cell strings may increase or decrease relative to that shown in FIG. 4. If the number of columns of cell strings is changed, the number of bit lines connected to columns of cell strings and the number of cell strings connected to a string selection line may also be changed.

A height of the cell strings may increase or decrease relative to that shown in FIG. 4. For example, the number of ground selection transistors, memory cells, or string selection transistors that are stacked in each cell string may increase or decrease.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string further includes at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 5:
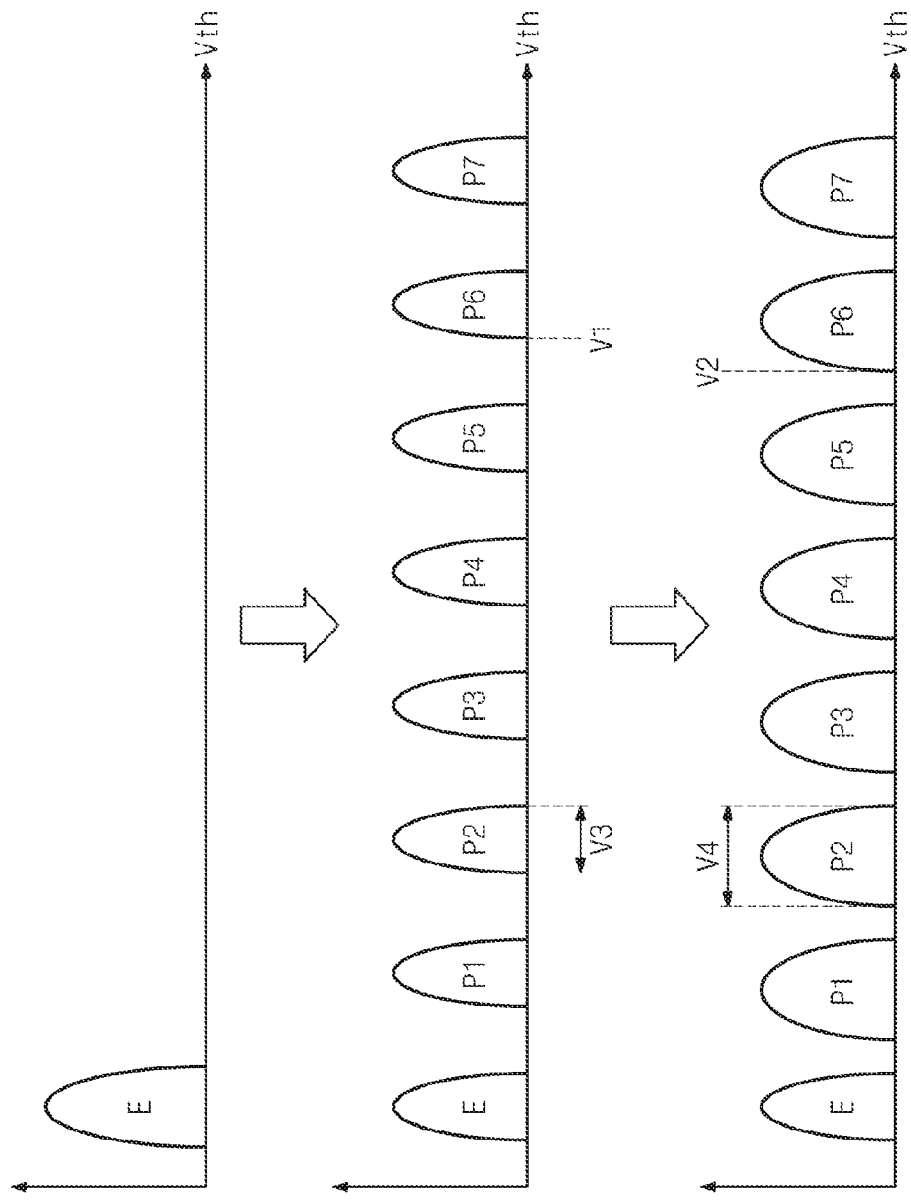
FIG. 5 is a graph showing an exemplary embodiment of variations in threshold voltage distributions of memory cells.

FIG. 5 is a graph showing an exemplary embodiment of variations in threshold voltage distributions of memory cells. In FIG. 5, the abscissa represents a threshold voltage Vth, and the ordinate represents the number of memory cells MC.

Referring to FIGS. 4 and 5, memory cells have an erase state E when erased. After the memory cells are erased and a first time passes (a first time after erase occurs), the memory cells may be programmed to the erase state E and first through seventh program states P1 through P7 (shown in the middle graph of FIG. 5). For example, the number of states that programmed memory cells can have varies with the number of bits programmed per cell. In FIG. 5, 3-bits of data may be represented by the erase state E and program states P1 through P7. However, the scope and spirit of the inventive concept is not limited thereto.

Threshold voltage distributions of the memory cells vary as the memory cells are programmed and a time passes after programming. This shown in the bottom graph of FIG. 5. For example, the lower limit of a threshold voltage distribution range corresponding to the sixth program state P6 may decrease from a first voltage V1 to a second voltage V2, and a width of a threshold voltage distribution range corresponding to the second program state P2 may widen from a third voltage V3 to a fourth voltage V4. That is, as the memory cells are programmed and a time passes, the lower limit of each threshold voltage distribution range is lower, while the width thereof widens. On this occasion, the probability that an error occurs upon reading memory cells becomes higher. This means that the reliability of memory cells decreases.

Figure 6:
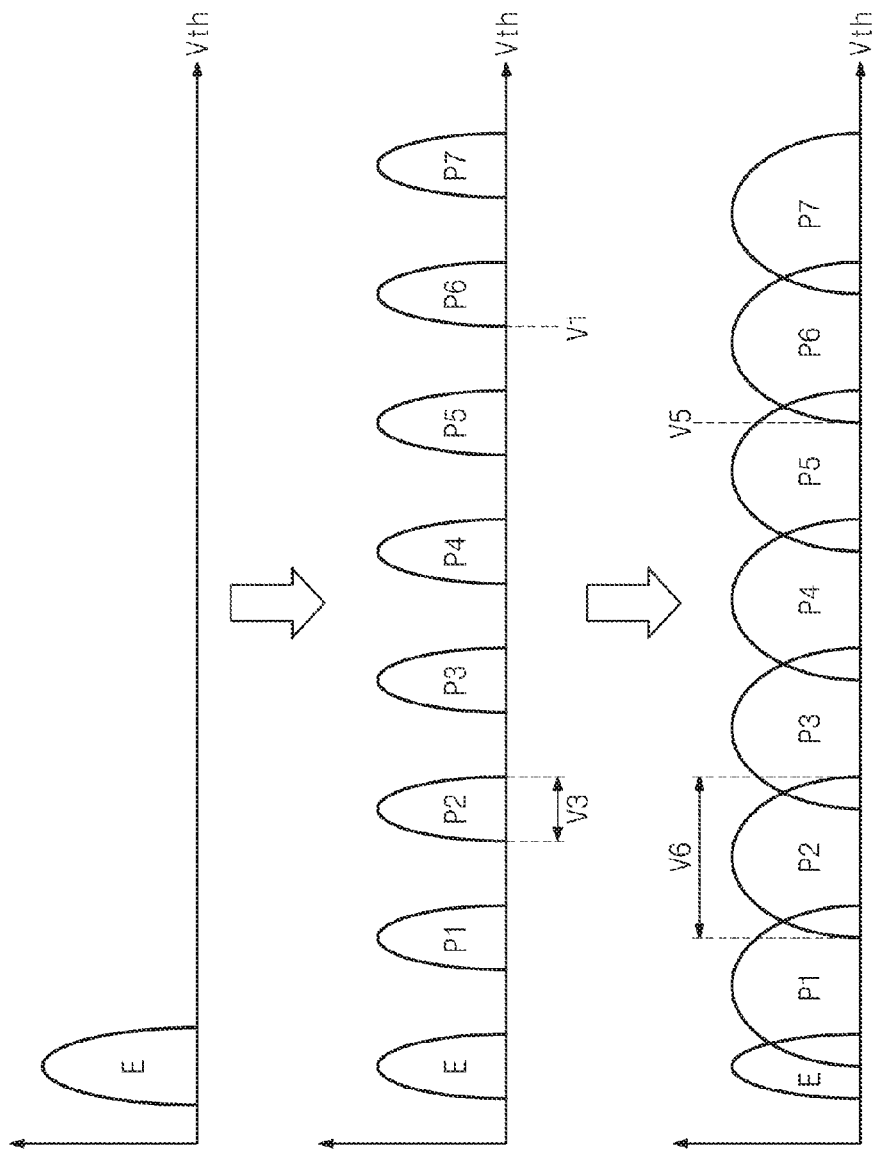
FIG. 6 is a graph showing another exemplary embodiment of variations in threshold voltage distributions of memory cells.

FIG. 6 is a graph showing another exemplary embodiment of variations in threshold voltage distributions of memory cells. In FIG. 6, the abscissa represents a threshold voltage Vth, and the ordinate represents the number of memory cells MC.

Referring to FIGS. 4 and 6, memory cells have an erase state E when erased. After the memory cells are erased and a second time passes (a second time after erase occurs), the memory cells may be programmed to the erase state E and first through seventh program states P1 through P7 (as shown in the middle graph of FIG. 6. Here, however, the second time after erase is longer than the above-described first time after erase of FIG. 5.

As in FIG. 5, and as shown by the bottom graph of FIG. 6, the threshold voltage distributions of memory cells vary as the memory cells are programmed and a time elapses after programming. However, since the second time after erase of FIG. 6 is greater than the first time after erase of FIG. 5, the variation in thresholds voltages is more pronounced in FIG. 6. For example, the lower limit of a threshold voltage distribution range corresponding to the sixth program state P6 may become lower from a first voltage V1 to a fifth voltage V5, while a width of a threshold voltage distribution range corresponding to the second program state P2 widens from a third voltage V3 to a sixth voltage V6.

Referring to FIGS. 5 and 6, as times after erase on memory cells increase, the lower limit of each threshold voltage distribution range becomes lower, and a width thereof becomes wider. That is, as times after erase on memory cells increase, the reliability thereof decreases.

To address the above-described problem, as described with reference to FIGS. 1 and 2, a storage device 100 according to an exemplary embodiment of the inventive concept may be implemented to manage times after erase on memory cells.

Figure 7:
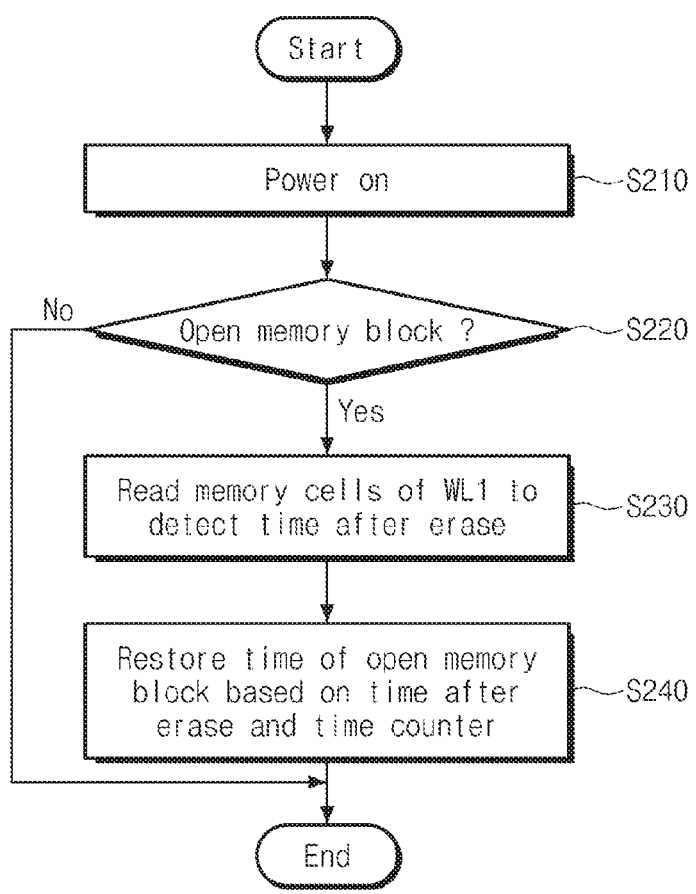
FIG. 7 is a flow chart showing a first embodiment of a method in which a time calculator calculates times after erase on previously programmed memory cells.

FIG. 7 is a flow chart showing a first embodiment of a method in which a time calculator 128 calculates times after erase on previously programmed memory cells. In FIG. 7, there is exemplarily illustrated a method in which a time calculator calculates a time in response to power-on of a storage device 100.

Referring to FIGS. 1, 3, 4, and 7, in step S210, a power is supplied to the storage device 100.

In step S220, a memory controller 120 determines whether memory blocks BLK1 through BLKz of a nonvolatile memory 110 include an open memory block. The open memory block may be a memory block that is selected to program data. For example, the memory controller 120 may select one memory block, in which data is to be programmed, from among the memory blocks BLK1 through BLKz. The selected memory block may be the open memory block. The memory controller 120 writes data at memory cells of the open memory block. If programming of the memory cells of the open memory block is completed, the memory controller 120 closes the open memory block. Afterwards, the memory controller 120 selects and opens any other memory block. That is, the open memory block may indicate a memory block that is selected for the memory controller 120 to program data and in which data is not yet programmed.

The time calculator 128 does not operate when the open memory block does not exist. As a consequence of determining that the open memory block exists, the method proceeds to step S230.

In step S230, the memory controller 120 reads memory cells, connected to a first word line WL, from among the memory cells of the open memory block and detects a time after erase of the open memory block. For example, the memory cells of the open memory block may be programmed such that memory cells immediately adjacent to a ground selection line GSL are first programmed and memory cells immediately adjacent to a string selection line SSL are finally programmed. The memory controller 120 reads first programmed memory cells of the memory cells of the open memory block. The time calculator 128 detects a time after erase based on a result of reading the first programmed memory cells.

In exemplary embodiments, a time during which first programmed memory cells of memory cells of an open memory block are erased and then are left may be shortest. For example, when the open memory block is erased and memory cells MC1 connected with a first word line WL1 are immediately programmed, the memory cells MC1 are not left after erased. That is, the first programmed memory cells do not experience a threshold voltage variation that occurs when they are erased and then are left.

In general, threshold voltages of programmed memory cells may become lower with the lapse of time. If a threshold voltage variation that occurs when memory cells are erased and then are left is excluded from first programmed memory cells, a threshold voltage variation of the first programmed memory cells may indicate a time after erase. That is, a time after erase of an open memory block from which an erased-after-left effect is excluded may be detected by reading first programmed memory cells.

In step S240, the time calculator 128 restores a time of the open memory block based on the detected time after erase and a time counter. For example, the time calculator 128 may include the time counter that counts an internal clock or a clock from an external host device to measure the lapse of time. The time calculator 128 may restore a local time of the open memory block that passes after the open memory block is erased, based on the time after erase of the open memory block and the lapse of time.

As described above, once the storage device 100 is powered on, a local time of an open memory block may be restored. For example, the storage device 100 may restore the local time of the open memory block as a part of a power-on process or at an idle time after a power is supplied. The restored local time of the open memory block may be updated by the time calculator 128 in real time.

Referring back to FIG. 2, when the open memory block is programmed (S120), the time calculator 128 programs the local time of the open memory block at spare or meta memory cells of the nonvolatile memory 110 as meta data (S130).

When the open memory block is closed, the time calculator 128 may terminate the local time of the open memory block.

Figure 8:
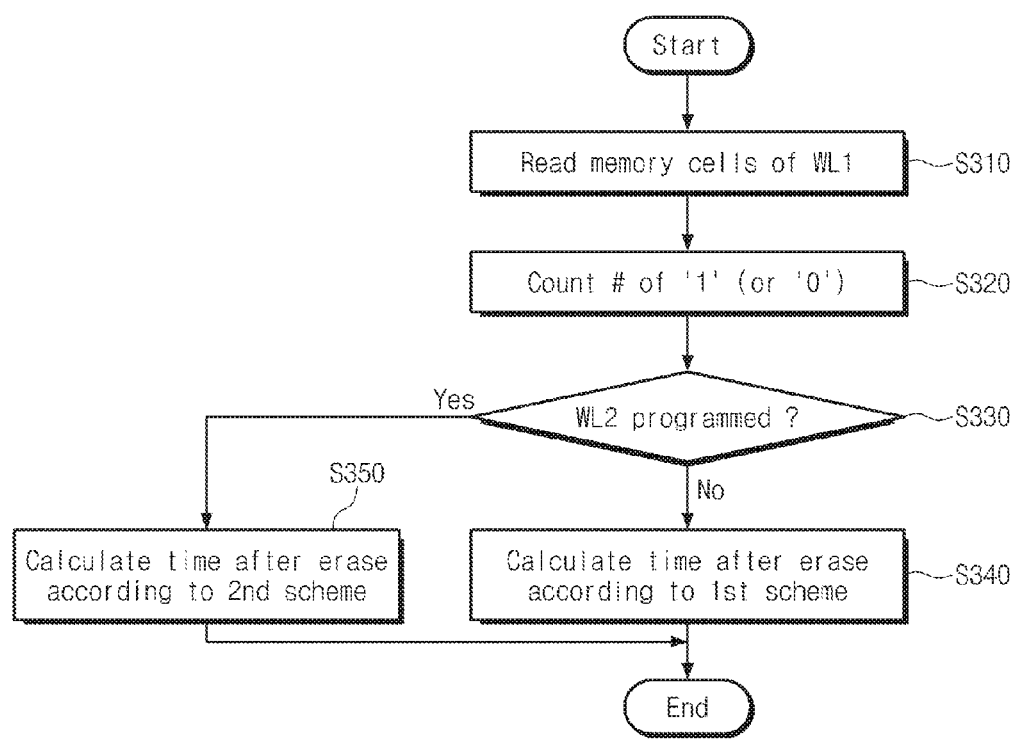
FIG. 8 is a flow chart showing a method for detecting a time after erase, according to an exemplary embodiment of the inventive concept.
Figure 9:
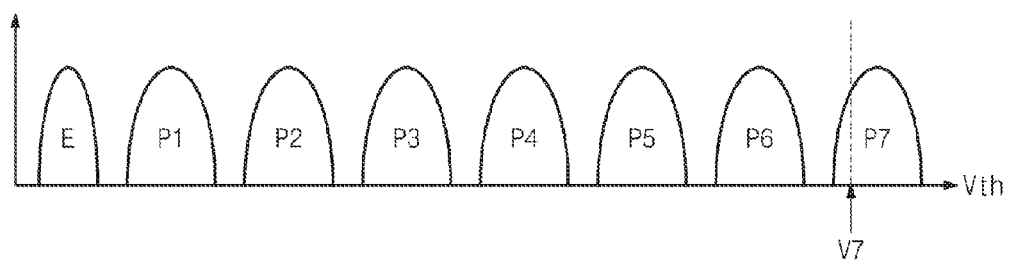
FIG. 9 shows an embodiment in which a memory controller reads memory cells of a first word line according to a method shown in FIG. 8.

FIG. 8 is a flow chart showing a method (S230) for detecting a time after erase, according to an exemplary embodiment of the inventive concept. FIG. 9 shows an embodiment in which a memory controller 120 reads memory cells MC1 of a first word line WL1 according to a method shown in FIG. 8. In FIG. 9, the abscissa represents a threshold voltage Vth, and the ordinate represents the number of memory cells MC1.

Referring to FIGS. 1, 3, 4, 8, and 9, in step S310, a memory controller 120 reads memory cells of a first word line WL1 of a selected memory block (e.g., open memory block) that a nonvolatile memory 120 includes. For example, the memory controller 120 reads the memory cells of the first word line WL1 once using a predetermined read voltage.

The memory controller 120 may perform a read operation with respect to a seventh program state P7. The memory controller 120 performs a read operation using a seventh voltage V7 associated with the seventh program state P7. For example, the seventh voltage V7 may be a verification voltage that is used upon programming memory cells MC1 to the seventh program state P7. Upon programming the memory cells MC1 to the seventh program state P7, threshold voltages of the memory cells MC1 may be adjusted to be higher than the seventh voltage V7. Thus, that memory cells MC1 that have threshold voltages lower than the seventh voltage V7 exist may mean that threshold voltages of the memory cells MC1 decrease. That is, a threshold voltage lower than the seventh voltage V7 may correlate to a time that passes after the memory cells MC1 are programmed.

In S320, the memory controller 120 counts the number of 1s or 0s in the read result. For example, when a read operation is carried out using the seventh voltage V7, memory cells MC1 of which the threshold voltages are lower than the seventh voltage V7 are reads as "1", and memory cells MC1 of which the threshold voltages are higher than the seventh voltage V7 are reads as "0".

In exemplary embodiments, the memory controller 120 may randomized data to be programmed at the nonvolatile memory 110. The randomized data may make an erase state E and first through seventh program states P1 through P7 uniform. Thus, a value that is obtained by dividing the number of memory cells MC1 connected with the first word line WL1 by the number of the erase and program states E and P1 through P7 may indicate the number of memory cells MC1 programmed to the seventh program state P7. When the number of memory cells MC1 of which the threshold voltages higher than the seventh voltage V7 is smaller than a divided value, threshold voltages of partial memory cells of the memory cells MC1 programmed to the seventh program state P7 are determined as being lower than the seventh voltage V7.

In other exemplary embodiments, the memory controller 120 may program the number of memory cells, programmed to the seventh program state P7, from among the memory cells MC1 of the first word line WL1 at spare or meta memory cells. The memory controller 120 reads information on the number of seventh program states P7 from the spare or meta memory cells and compares the read information with a result of performing a read operation using the seventh voltage V7.

In still other exemplary embodiments, the memory controller 120 may read data from the memory cells MC1 of the first word line WL1 according to a typical read method. The memory controller 120 performs error correction with respect to data read from the memory cells MC1. The memory controller 120 counts the number of seventh program states P7 from the error-corrected data. The memory controller 120 compares the count result with a result of performing a read operation using the seventh voltage V7.

In step S330, whether memory cells MC2 of a second word line WL2 adjacent to the first word line are programmed is determined. As a consequence of determining that the memory cells MC2 of the second word line WL2 are not programmed, in step S340, a time after erase is calculated according to a first scheme. For example, the time after erase may be calculated based on the number of memory cells, of which the threshold voltages are lower than the seventh voltage V7, from among memory cells MC1 programmed to the seventh program state P7.

As a consequence of determining that the memory cells MC2 of the second word line WL2 are programmed, in step S350, a time after erase is calculated according to a second scheme. For example, the time after erase may be calculated based on the number of memory cells, of which the threshold voltages are lower than the seventh voltage V7, from among memory cells MC1 programmed to the seventh program state P7.

The memory cells MC1 of the first word line WL1 may experience coupling when the memory cells MC2 of the second word line WL2 are programmed. The coupling may cause a threshold voltage variation of the memory cells MC1 of the first word line WL1. Thus, a time calculator 128 calculates times after erase using different schemes, based on whether the memory cells MC1 of the first word line WL1 suffer from coupling. For example, when memory cells adjacent to the memory cells MC1 are programmed to higher program state (e.g., P7), the memory cells MC1 may suffer higher coupling. When memory cells adjacent to the memory cells MC1 are programmed to lower program state (e.g., E or P1), the memory cells MC1 may suffer lower coupling. The higher the coupling, the higher the threshold voltages of the memory cells MC1 become. Thus, the higher the coupling, the time calculator 128 may increase the time after erase for compensating the coupling. In another embodiment, the higher the coupling, the time calculator 128 may decrease the time after erase.

An embodiment of the inventive concept is exemplified above in FIG. 9 as the memory controller 120 calculating a time after erase by performing a read operation with respect to the seventh program state P7. However, the scope and spirit of the inventive concept is not limited thereto.

Figure 10:
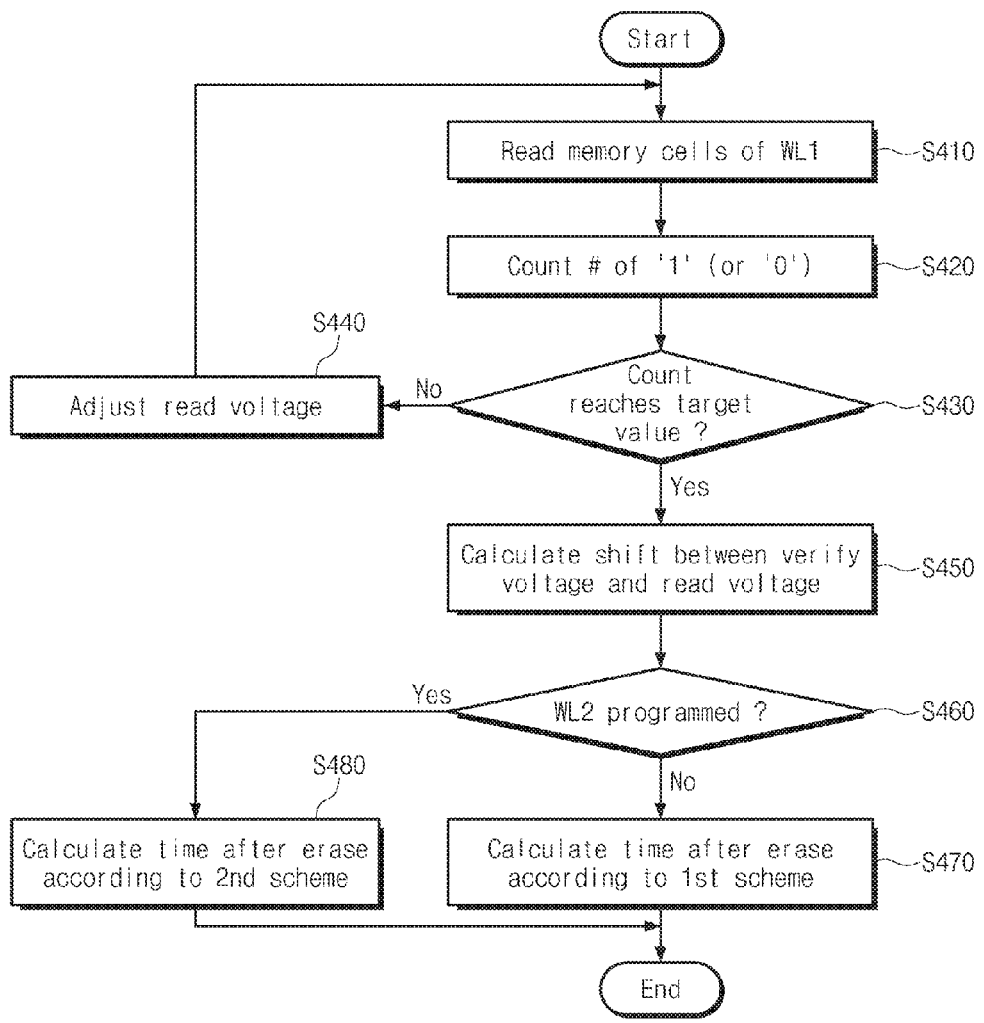
FIG. 10 is a flow chart showing a method for detecting a time after erase, according to another exemplary embodiment of the inventive concept.
Figure 11:
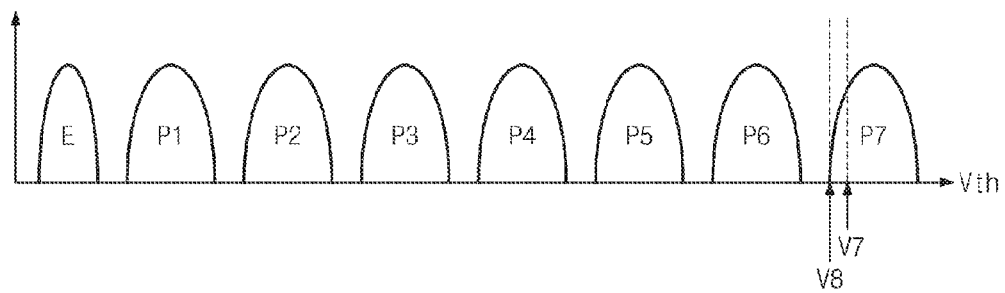
FIG. 11 shows an embodiment in which a memory controller reads memory cells of a first word line according to a method shown in FIG. 10.

FIG. 10 is a flow chart showing a method (S230) for detecting a time after erase, according to another exemplary embodiment of the inventive concept. FIG. 11 shows an embodiment in which a memory controller 120 reads memory cells MC1 of a first word line WL1 according to a method shown in FIG. 10. In FIG. 11, the abscissa represents a threshold voltage Vth, and the ordinate represents the number of memory cells MC1.

Referring to FIGS. 1, 3, 4, 10, and 11, in step S410, a memory controller 120 reads memory cells of a first word line WL1. The memory controller 120 reads the memory cells of the first word line WL1 once using a predetermined read voltage.

The memory controller 120 may perform a read operation with respect to a seventh program state P7. The memory controller 120 performs a read operation using a seventh voltage V7 associated with the seventh program state P7. For example, the seventh voltage V7 may be a verification voltage that is used upon programming memory cells MC1 to the seventh program state P7.

In S420, the memory controller 120 counts the number of 1s or 0s in the read result. For example, the memory controller 120 counts the number of memory cells MC1 of which the threshold voltages are higher than the seventh voltage V7.

In step S430, the memory controller 120 determines whether a count value reaches a target value. For example, the target value may indicate the number of memory cells programmed to the seventh program state P7 when the memory cells MC1 of the first word line WL1 are programmed. For example, as described with reference to FIG. 9, the target value may be a value obtained by dividing the number of memory cells MC1 of the word line WL1 by the number of erase and program states E and P1 through P7, a value read from spare or meta memory cells, or a value determined through typical read and error correction operations.

When the count value does not reach the target value, the method proceeds to step S440, in which a read voltage is adjusted. For example, the read voltage may be decreased into an eighth voltage V8 under control of the memory controller 120. Afterwards, in step S410, the memory controller 120 performs a read operation using the read voltage V8 thus decreased. When the count value reaches the target value, the method proceeds to step S450. That is, the lower limit of a threshold voltage distribution range corresponding to the seventh program state P7 is detected in steps S410 through S440.

In step S450, a time calculator 128 calculates a shift between a verification voltage and a final read voltage of the seventh program state P7. For example, the time calculator 128 calculates a difference between the seventh voltage V7 and the eighth voltage V8. The calculated difference may correlate to a variation in the lower limit of the threshold voltage distribution range corresponding to the seventh program state P7.

In step S460, whether memory cells MC2 of a second word line WL2 adjacent to the first word line are programmed is determined. As a consequence of determining that the memory cells MC2 of the second word line WL2 are not programmed, in step S470, a time after erase is calculated according to a first scheme. For example, the time after erase may be calculated based on a variation in the lower limit of the threshold voltage distribution range corresponding to the seventh program state P7.

As a consequence of determining that the memory cells MC2 of the second word line WL2 are programmed, in step S480, a time after erase is calculated according to a second scheme. For example, the time after erase may be calculated based on a variation in the lower limit of the threshold voltage distribution range corresponding to the seventh program state P7.

The memory cells MC1 of the first word line WL1 may experience coupling when the memory cells MC2 of the second word line WL2 are programmed. The coupling may cause a threshold voltage variation of the memory cells MC1 of the first word line WL1. Thus, the time calculator 128 calculates times after erase using different schemes, based on whether the memory cells MC1 of the first word line WL1 suffer coupling.

An embodiment of the inventive concept is exemplified as in FIG. 11 in which the memory controller 120 calculates a time after erase by performing a read operation with respect to the seventh program state P7. However, the scope and spirit of the inventive concept is not limited thereto.

Figure 12:
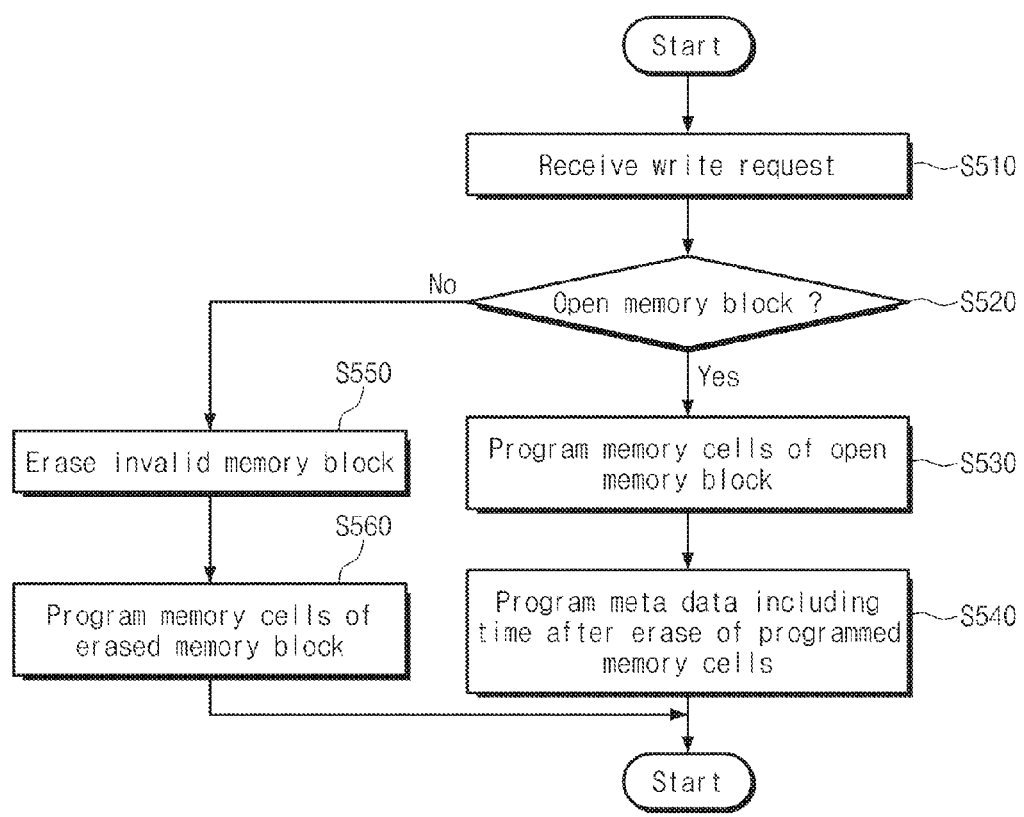
FIG. 12 is a flow chart showing a condition in which a storage device performs an erase operation, according to an exemplary embodiment of the inventive concept.

FIG. 12 is a flow chart showing a condition in which a storage device 100 performs an erase operation, according to an exemplary embodiment of the inventive concept. Referring to FIGS. 1, 3, 4, and 12, in step 510, a storage device 100 receives a write request. For example, the storage device 100 may receive a write request from an external host device.

In step S520, whether an open memory block exists is determined. When the open memory block exists, in step S530, memory cells of the open memory block are programmed. For example, the memory controller 120 may program data, received together with the write request from the external host device, at the memory cells of the open memory block. In step S540, the memory controller 120 programs meta data, which includes a time after erase on programmed memory cells, at spare or meta memory cells of a nonvolatile memory 110. For example, the memory controller 120 may program a local time of the open memory block as meta data.

When the open memory block does not exist, in step S550, the memory controller 120 erases an invalid memory block of memory blocks BLK1 through BLKz. In step S560, the memory controller 120 opens the erased memory block and programs memory cells of the erased memory block, that is, an open memory block. For example, the memory controller 120 may program data, which is received together with the write request from the external host device, at memory cells of the open memory block.

As described with reference to FIG. 12, when the nonvolatile memory 110 does not include an open memory block and data to be programmed at the nonvolatile memory 110 exists, the storage device 100 erases a memory block and programs the data at the erased memory block. In accordance with an exemplary embodiment of the inventive concept, memory cells MC1 of a first word line WL1 are programmed immediately after erased. Thus, the memory cells MC1 are not left in the erase state after the erase operation for an extended period of time, and the accuracy on a time after erase calculated from the memory cells MC1 is improved.

In other exemplary embodiments, the storage device 100 may issue a write request according to internal policies such as read reclaim and garbage collection. When the write request is issued according to the read reclaim or the garbage collection, the memory controller 120 may erase an invalid memory block of the memory blocks BLK1 through BLKz. The memory controller 120 opens the erased memory block and programs memory cells of the opened memory block.

FIG. 13 is a table exemplarily showing meta data indicative of times after erase managed according to an exemplary embodiment of the inventive concept. Referring to FIGS. 1, 3, 4, and 13, memory cells MC1 through MC5 of first through fifth word lines WL1 through WL5 remain at a programmed state, and memory cells MC6 of a sixth word line WL6 remain at an unprogrammed state.

As described with reference to FIG. 12, memory cells MC1 of a first word line WL1 may be programmed immediately after being erased. The memory cells MC1 may not be left in an erased state after being erased. A time elapsed (i.e., a time after erase) from a point in time when the memory cells MC1 are erased until a point in time when they are programmed may be "0". Thus, meta data on the memory cells MC1 may not be separately managed.

The memory cells MC2 of the second word line WL2 may be programmed after a memory block BLKa is erased and a first time interval TI1 passes. The first time interval TI1 may be registered as meta data on the memory cells MC2. Likewise, second through fourth time intervals TI2 through TI4 may be registered as meta data on the memory cells MC3 through MC5 of the third through fifth word lines WL3 through WL5, respectively.

Figure 14:
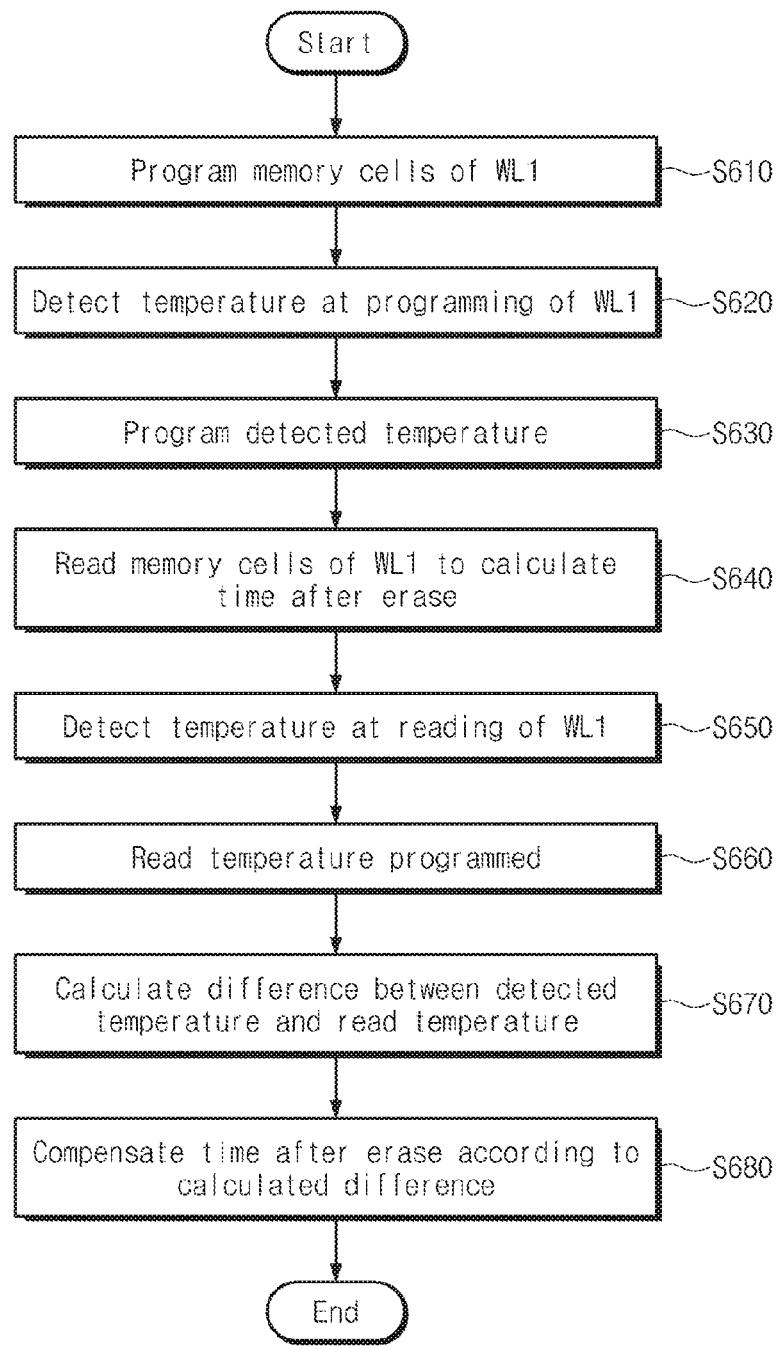
FIG. 14 is a flow chart showing a method for compensating a time after erase based on a temperature variation.

FIG. 14 is a flow chart showing a method for compensating a time after erase based on a temperature variation. Referring to FIGS. 1, 3, 4, and 14, in step S610, a memory controller 120 programs memory cells MC1 of a first word line WL1.

In step S620, the memory controller 120 detects a temperature when the memory cells MC1 of the first word line WL1 are programmed. For example, the memory controller 120 may detect a temperature when the memory cells MC1 are programmed, based on temperature information from an internal temperature sensor (not shown) or an external host device.

In step S630, the memory controller 120 programs the detected temperature at spare or meta memory cells corresponding to the programmed memory cells.

In step S640, the memory controller 120 reads the memory cells MC1 of the first word line WL1 and calculates a time after erase.

In step S650, the memory controller 120 detects a temperature upon reading the memory cells MC1 of the first word line WL1. For example, the memory controller 120 may detect a temperature upon reading the memory cells MC1 of the first word line WL1, based on temperature information from an internal temperature sensor or the external host device.

In step S660, the memory controller 120 reads a temperature that is programmed at spare or meta memory cells corresponding to the memory cells MC1 of the first word line WL1.

In step S670, the memory controller 120 calculates a difference between the temperature read in step S650 and the temperature read in step S660.

In step S680, the memory controller 120 compensates for a time after erase according to the calculated difference. For example, the memory controller 120 increase the time after erase when the detected temperature is higher than the read temperature. The higher the detected temperature, the longer the time after erase become for compensation. The memory controller 120 decrease the time after erase when the detected temperature is lower than the read temperature. The lower the detected temperature, the shorter the time after erase become for compensation. However, embodiments of the inventive concepts are not limited. For example, the memory controller 120 decrease the time after erase when the detected temperature is higher than the read temperature. The memory controller 120 increase the time after erase when the detected temperature is lower than the read temperature.

In exemplary embodiments, threshold voltages of memory cells MC1 are considered to be different when a temperature upon programming the memory cells MC1 of the first word line WL1 differs from a temperature upon reading the memory cells MC1 of the first word line WL1. In accordance with an exemplary embodiment of the inventive concept, compensation for the time after erase may be made according to a difference between a temperature upon programming the memory cells MC1 of the first word line WL1 and a temperature upon reading the memory cells MC1 of the first word line WL1. Thus, the reliability on the time after erase is improved.

FIG. 15 is a table showing meta data including both time after erase and temperature information, according to an exemplary embodiment of the inventive concept. As compared with FIG. 13, temperature information TEMP is registered as meta data of memory cells MC1 of a first word line WL1. The temperature information TEMP indicates a temperature when the memory cells MC1 are programmed.

Figure 16:
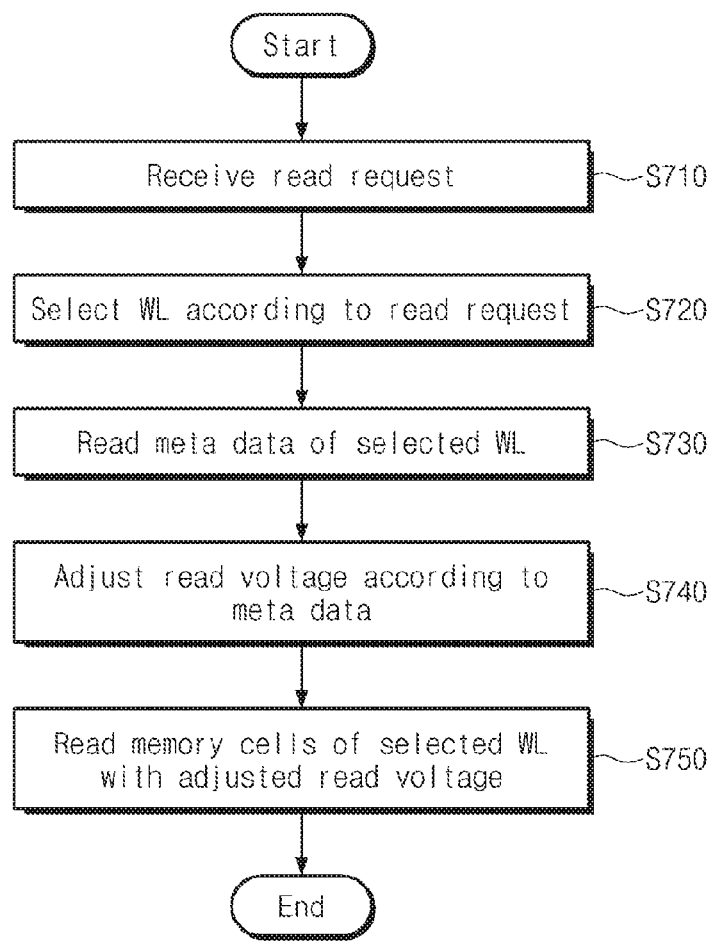
FIG. 16 is a flow chart showing an embodiment in which a read operation is performed using a time after erase registered as meta data.

FIG. 16 is a flow chart showing an embodiment in which a read operation is performed using a time after erase registered as meta data. Referring to FIGS. 1, 3, 4, and 16, in step S710, a storage device 100 receives a read request.

In step S720, a memory controller 120 selects a word line in response to the read request. For example, the memory controller 120 may select a memory block and a word line, based on an address received together with the read request.

In step S730, the memory controller 120 reads meta data of the selected word line that the selected memory block includes. For example, the memory controller 120 may read meta data from spare or meta memory cells corresponding to memory cells of the selected word line.

In step S740, the memory controller 120 adjusts a read voltage based on the meta data.

In step S750, the memory controller 120 reads memory cells of the selected word line using the adjusted read voltage.

As described above, a storage device 100 may adjust read voltages which are used to read memory cells, based on a time after erase registered as meta data on memory cells. For example, the memory controller 120 may predict a variation in a threshold voltage distribution range of memory cells using a time after erase read as meta data. The memory controller 120 may adjust a read voltage according to the predicted result, thereby improving the reliability of a read operation. For example, the read voltage may be reduced as the time after erase indicated by the meta data increases.

In exemplary embodiments, as described with reference to FIGS. 13 through 15, memory cells MC1 of a first word line WL1 do not have a time after erase as meta data. When receiving a read request on the memory cells MC1 of the first word line WL1, the memory controller 120 does not perform an operation for adjusting a read voltage using meta data.

In exemplary embodiments, the memory controller 120 may manage meta data on memory cells on a RAM 130. In this case, the memory controller 120 may read meta data from the RAM 130, not spare or meta memory cells of a nonvolatile memory 110.

Figure 17:
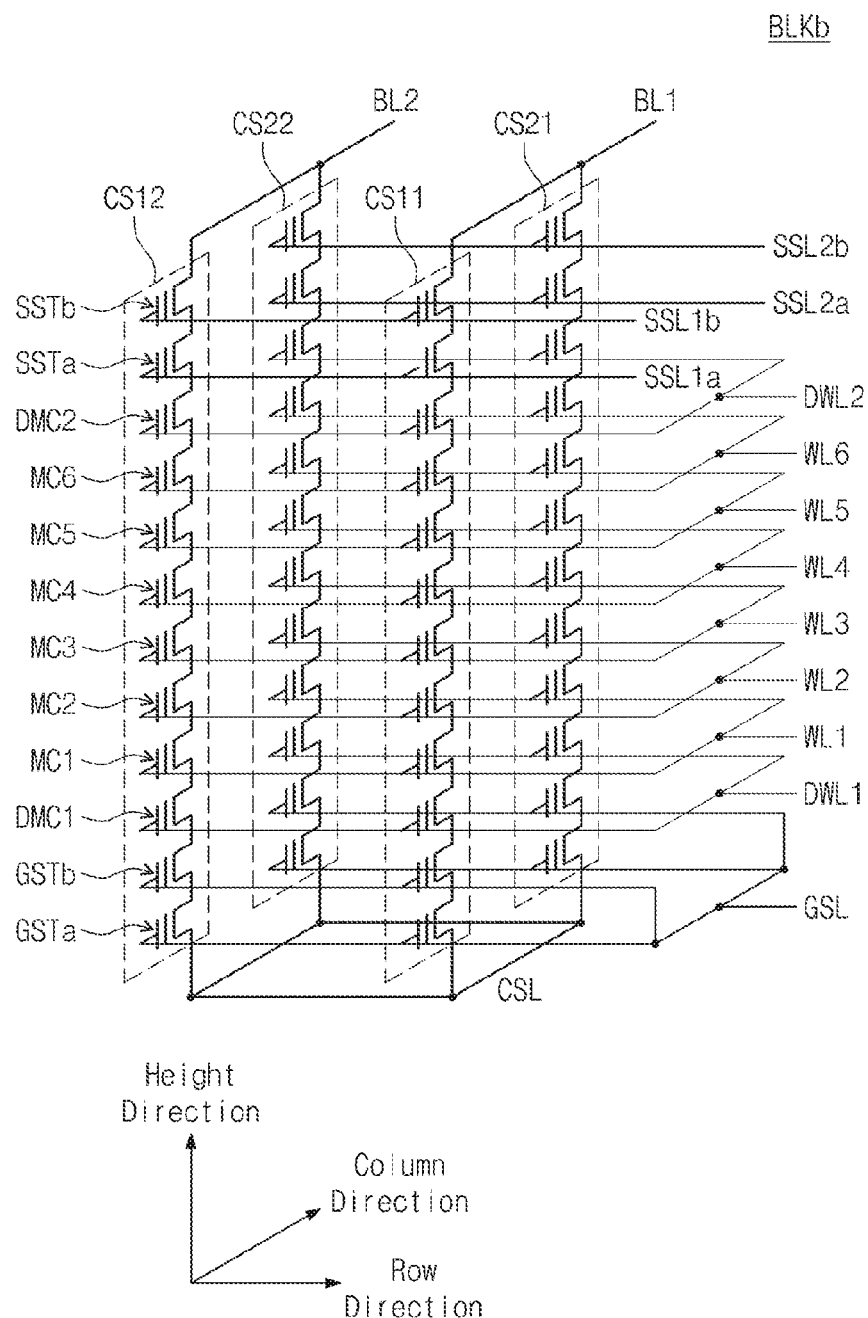
FIG. 17 is a circuit diagram showing a memory block according to another exemplary embodiment of the inventive concept.

FIG. 17 is a circuit diagram showing a memory block BLKb according to another exemplary embodiment of the inventive concept. As compared with a memory block BLKa of FIG. 4, dummy memory cells DMC1 are provided between memory cells MC1 and ground selection transistors GSTb of a memory block BLKb. The dummy memory cells DMC1 are connected in common to a first dummy word line DWL1. Also, dummy memory cells DMC2 are provided between memory cells MC6 and string selection transistors SSTa of the memory block BLKb. The dummy memory cells DMC2 are connected in common to a second dummy word line DWL2.

Figure 18:
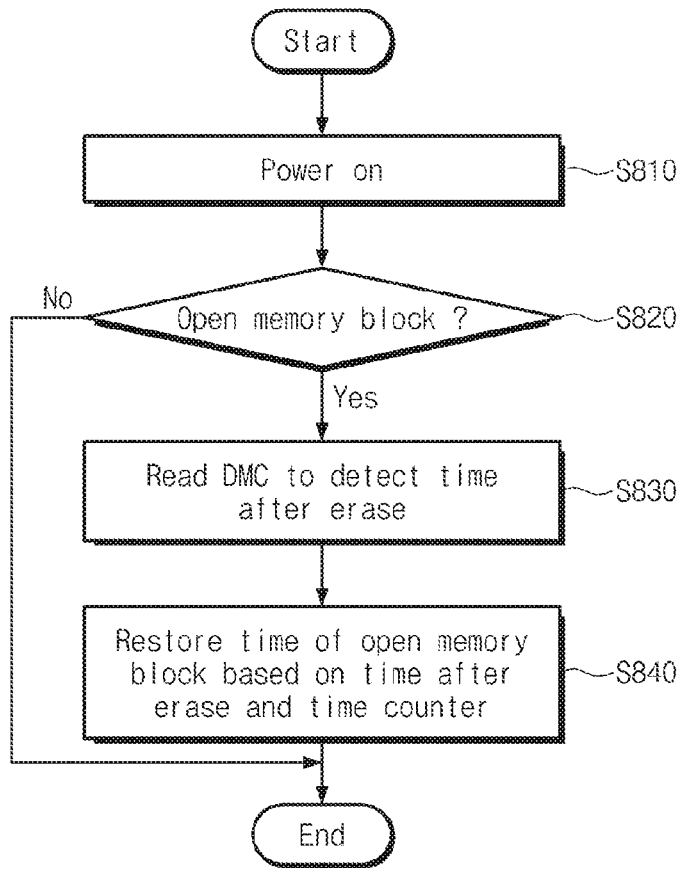
FIG. 18 is a flow chart showing a second embodiment of a method in which a time calculator calculates times after erase on previously programmed memory cells.

FIG. 18 is a flow chart showing a second embodiment of a method in which a time calculator 128 calculates times after erase on previously programmed memory cells. In FIG. 18, there is exemplarily illustrated a method in which a time calculator calculates a time in response to power-on of a storage device 100.

Referring to FIGS. 1, 3, 17, and 18, in step S810, a power is supplied to the storage device 100.

In step S820, a memory controller 120 determines whether memory blocks BLK1 through BLKz of a nonvolatile memory 110 include an open memory block.

The time calculator 128 does not operate when the open memory block does not exist. As a consequence of determining that the open memory block exists, the method proceeds to step S830.

In step S830, the memory controller 120 reads dummy memory cells, connected to a dummy word line DWL1 or DWL2, from among memory cells of the open memory block and detects a time after erase of the open memory block. For example, the dummy memory cells DMC1 or DMC2 of the open memory block may be programmed first after a memory block BLKb is erased. The dummy memory cells DMC1 or DMC2 may be programmed to have predetermined dummy threshold voltages. The time calculator 128 detects a time after erase based on a result of reading the first programmed dummy memory cells DMC1 or DMC2.

In step S840, the time calculator 128 restores a time of the open memory block based on the detected time after erase and a time counter. For example, the time calculator 128 may include the time counter that counts an internal clock or a clock from an external host device to measure the lapse of time. The time calculator 128 may restore a local time of the open memory block that passes after the open memory block is erased, based on the time after erase of the open memory block and the lapse of time.

When the open memory block is programmed (S120), the time calculator 128 programs the local time of the open memory block at spare or meta memory cells of the nonvolatile memory 110 as meta data (S130).

In exemplary embodiments, an operation for detecting a time after erase from dummy memory cells DMC may be performed according to a method described with reference to FIGS. 7 through 10.

In exemplary embodiments, as described with reference to FIG. 15, a time after erase may be used to read memory cells.

Figure 19:
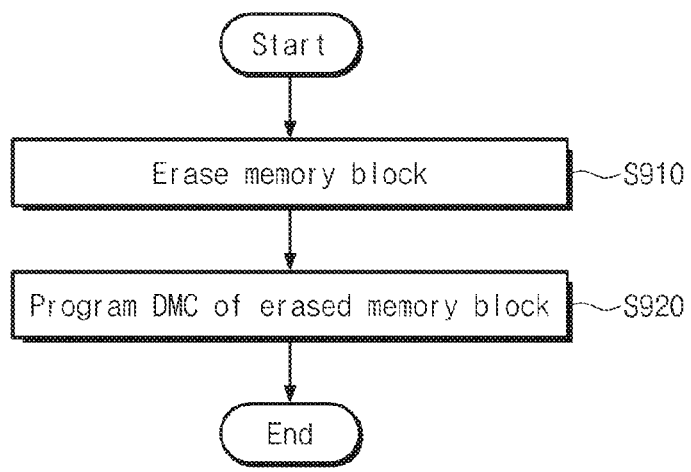
FIG. 19 is a flow chart showing a condition in which dummy memory cells are programmed, according to an exemplary embodiment of the inventive concept.

FIG. 19 is a flow chart showing a condition in which dummy memory cells DMC1 and DMC2 are programmed, according to an exemplary embodiment of the inventive concept. Referring to FIGS. 1, 3, 17, and 19, in step S910, a memory controller 120 erases a memory block BLKb. In step S920, the memory controller 120 programs dummy memory cells DMC1 and DMC2 (e.g., simultaneously or sequentially) of the memory block BLKb immediately after the memory block BLKb is erased. For example, the memory controller 120 programs the dummy memory cells DMC1 and DMC2 so as to belong to a predetermined dummy threshold voltage range.

Since the dummy memory cells DMC1 and DMC2 are programmed immediately after the memory block BLKb is erased, they are not left after erased, thereby improving the reliability on a time after erase detected from the dummy memory cells DMC1 and DMC2.

FIG. 20 is a table showing meta data of a memory block BLKb including dummy memory cells DMC1 and DMC2, according to an exemplary embodiment of the inventive concept. Referring to FIGS. 1, 17, and 20, dummy memory cells DMC1 and DMC2 of dummy word lines DWL1 and DWL2 remain at a programmed data. Memory cells MC1 through MC5 of first through fifth word lines WL1 through WL5 remain at a programmed state, and memory cells MC6 of a sixth word line WL6 remain at an unprogrammed state.

As compared with a table of FIG. 13, a first time interval TI1 is registered as meta data of memory cells MC1 of a first word line WL1. The first time interval TI1 may indicate a time from a point in time when the memory block BLKb is erased until a point in time when the memory cells MC1 are programmed. Second through fourth time intervals TI2 through TI4 may be registered as meta data on the memory cells MC3 through MC5 of the third through fifth word lines WL3 through WL5, respectively. Since the dummy memory cells DMC1 and DMC2 of the dummy word lines DWL1 and DWL2 are programmed immediately after the memory block BLKb is erased, they do not have meta data indicating a time after erase.

FIG. 21 is a table showing meta data of a memory block BLKb including dummy memory cells DMC1 and DMC2, according to another exemplary embodiment of the inventive concept. As compared with a table of FIG. 20, temperature information TEMP is registered as meta data of dummy memory cells DMC1 and DMC2 of dummy word lines DWL1 and DWL2. The temperature information TEMP may indicate a temperature when the dummy memory cells DMC1 and DMC2 are programmed. Compensation for a time after erase may be made using the temperature information TEMP of the dummy memory cells DMC1 and DMC2 as described with reference to FIG. 13.

In FIG. 21, an embodiment of the inventive concept is exemplified as temperature information TEMP is registered as meta data of dummy memory cells DMC1 and DMC2. However, the scope and spirit of the inventive concept is not limited thereto. For example, temperature information TEMP may be registered as meta data of dummy memory cells DMC1 or as meta data of dummy memory cells DMC2.

Figure 22:
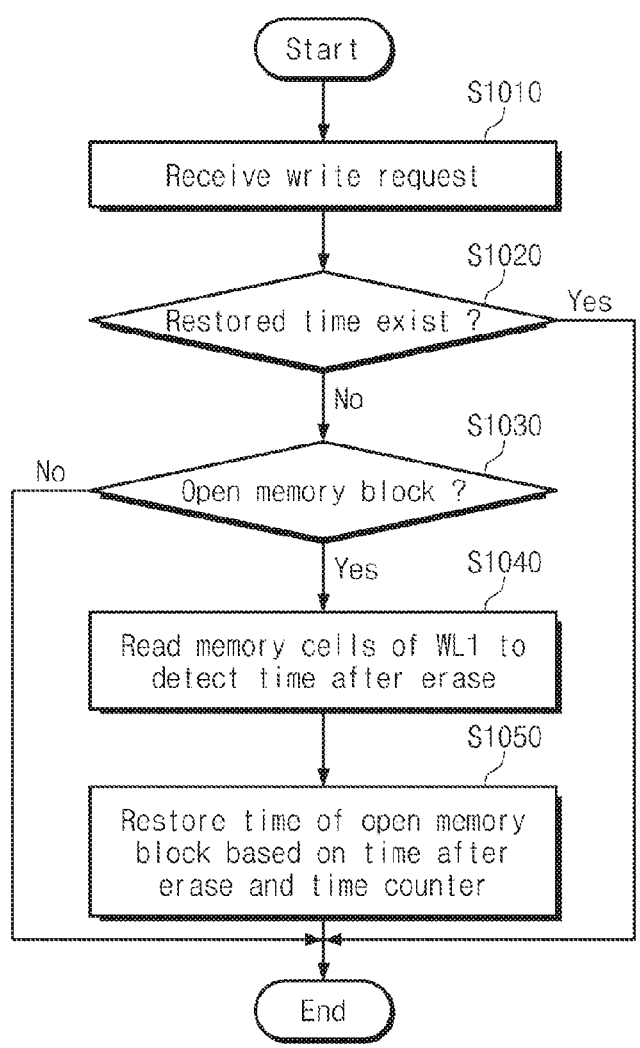
FIGS. 22, 23, 24, 25, 26 and 27 are flow charts showing a method in which a time calculator calculates a time after erase on previously programmed memory cells, according to exemplary embodiments of the inventive concept.

FIG. 22 is a flow chart showing a method (S110) in which a time calculator 128 calculates a time after erase on previously programmed memory cells, according to still other exemplary embodiment of the inventive concept. Referring to FIGS. 1, 3, 4, and 22, in step 1010, a storage device 100 receives a write request.

In step S1020, a memory controller 120 determines whether a restored time exists. For example, as described with reference to FIG. 7, the memory controller 120 may determine whether a local time of an open memory block is restored. When a restored time exists, the memory controller 120 does not calculate a time after erase separately. The memory controller 120 programs a nonvolatile memory 110 according to the write request and programs the restored time at the nonvolatile memory 110 as a time after erase.

When a restored time does not exist, in step S1030, the memory controller 120 determines whether an open memory block exists. When the open memory block does not exist, the memory controller 120 does not calculate a time after erase separately. As described with reference to FIG. 12, the memory controller 120 erases an invalid memory block and programs memory cells MC1 of a first word line WL1.

When the open memory block exists, in step S1040, the memory controller 120 reads the memory cells MC1 of the first word line WL1 to detect a time after erase of the open memory block.

In step S1040, a time calculator 128 restores a time of the open memory block, based on the detected time after erase and a time counter.

Afterwards, when the open memory block is programmed (S120), the time calculator 128 programs the local time of the open memory block at spare or meta memory cells of the nonvolatile memory 110 as meta data (S130).

As described above, the time calculator 128 is configured to restore a local time of an open memory block when a write request is received.

Figure 23:
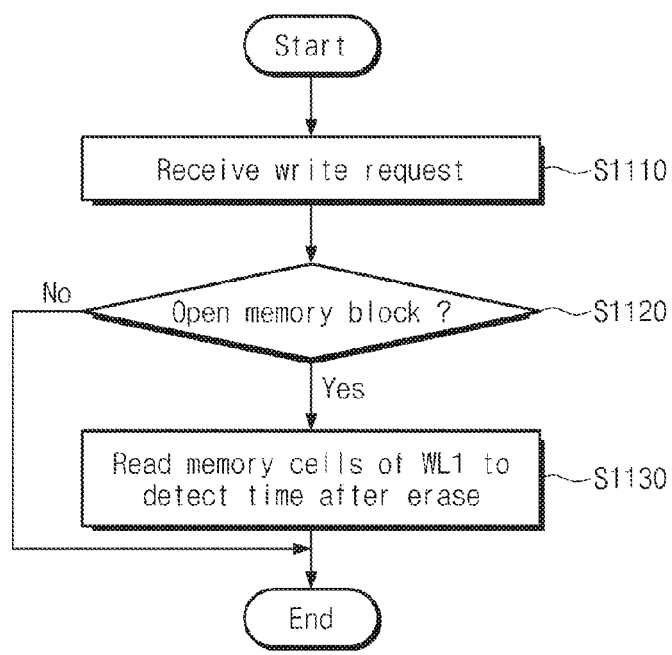

FIG. 23 is a flow chart showing a method (S110) in which a time calculator 128 calculates a time after erase on previously programmed memory cells, according to a further exemplary embodiment of the inventive concept. Referring to FIGS. 1, 3, 4, and 23, in step 1110, a storage device 100 receives a write request.

In step S1120, a memory controller 120 determines whether an open memory block exists. When the open memory block does not exist, the memory controller 120 does not calculate a time after erase separately. As described with reference to FIG. 12, the memory controller 120 erases an invalid memory block and programs memory cells MC1 of a first word line WL1.

When the open memory block exists, in step S1130, the memory controller 120 reads the memory cells MC1 of the first word line WL1 to detect a time after erase of the open memory block.

As described with reference to FIG. 23, the storage device 100 does not manage a local time of an open block in real time, but it detects a time after erase of an open memory block whenever a write request is issued.

Figure 24:
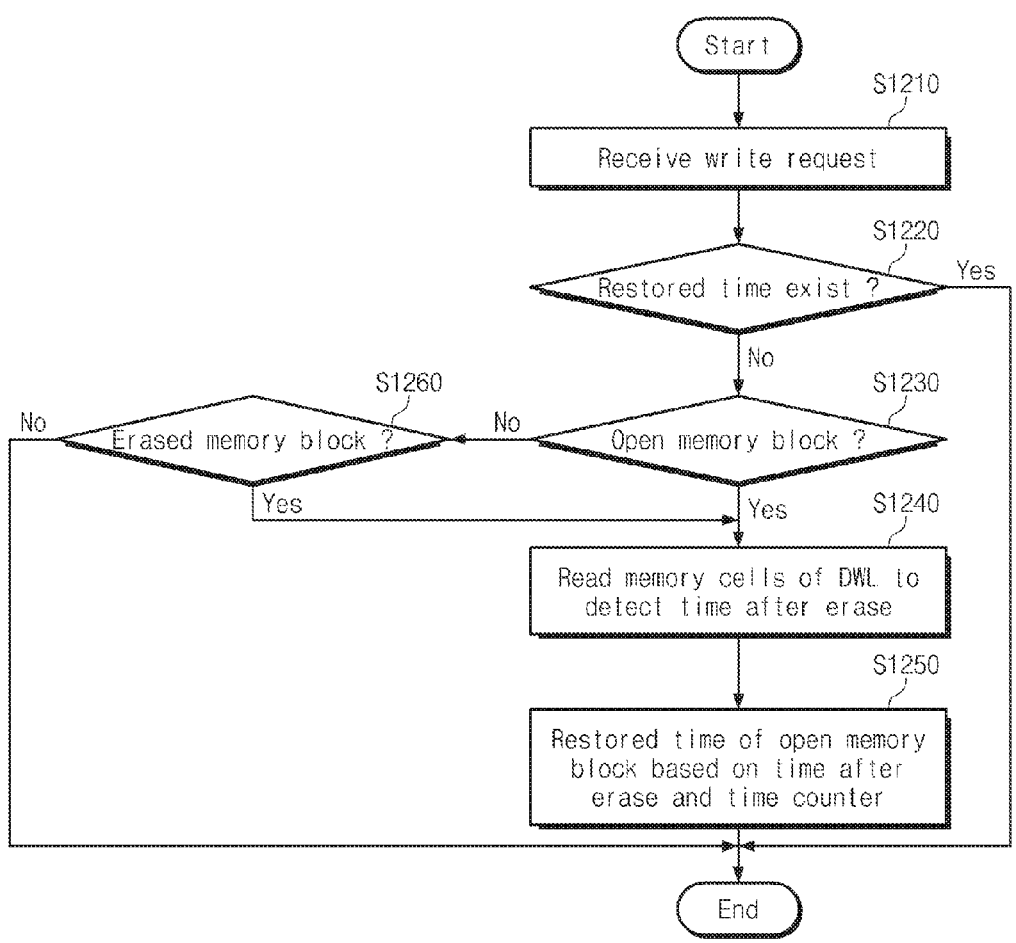

FIG. 24 is a flow chart showing a method (S110) in which a time calculator 128 calculates a time after erase on previously programmed memory cells, according to a further exemplary embodiment of the inventive concept. Referring to FIGS. 1, 3, 17, and 24, in step 1210, a storage device 100 receives a write request.

In step S1220, a memory controller 120 determines whether a restored time exists. When a restored time exists, the memory controller 120 does not calculate a time after erase separately. When a restored time does not exist, the method proceeds to step S1230.

In step S1230, the memory controller 120 determines whether an open memory block exists. When the open memory block exists, in step S1240, the memory controller 120 reads dummy memory cells DMC1 of DMC2 of a dummy word line DWL1 or DWL2 of the open memory block to detect a time after erase of the open memory block. In step S1250, a time calculator 128 restores a local time of the open memory block, based on the time after erase and a time counter.

When an open memory block does not exist, in step S1260, the memory controller 120 determines whether an erased memory block is opened. If an erased memory block is not opened, the time calculator 128 does not calculate a time after erase separately. For example, when an erased memory block is not opened, as described with reference to FIG. 19, an invalid memory block is erased, and dummy memory cells DMC1 and DMC2 are programmed. Afterwards, the erased memory block may be opened, and a local time of the opened memory block may be measured using the time counter.

When a previously erased memory block is opened, in step S1240, the memory controller 120 reads dummy memory cells DMC1 of DMC2 of a dummy word line DWL1 or DWL2 of the opened memory block to detect a time after erase of the opened memory block. In step S1250, the time calculator 128 restores a local time of the opened memory block, based on the time after erase and a time counter.

Figure 25:
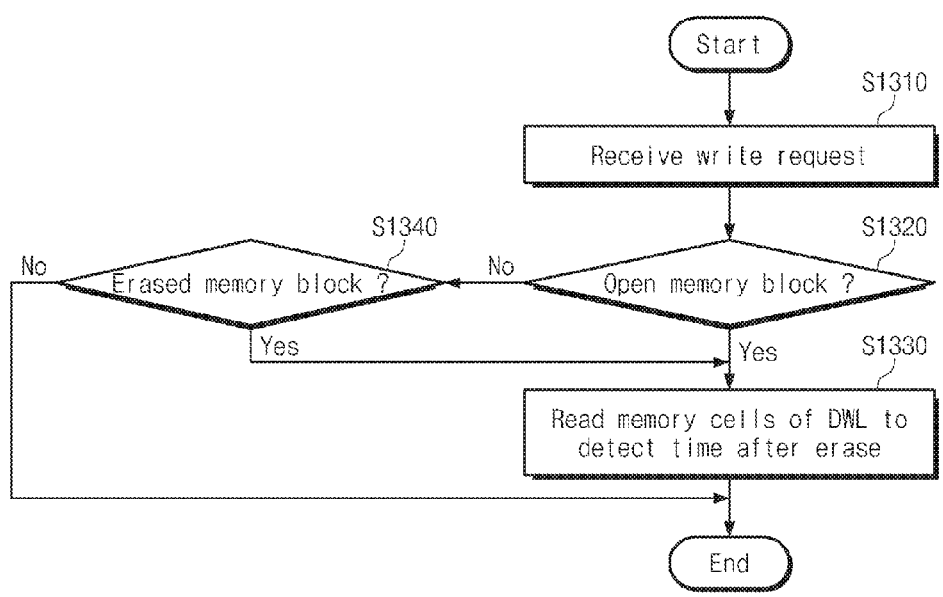

FIG. 25 is a flow chart showing a method (S110) in which a time calculator 128 calculates a time after erase on previously programmed memory cells, according to a further exemplary embodiment of the inventive concept. Referring to FIGS. 1, 3, 17, and 25, in step 1310, a storage device 100 receives a write request.

In step S1320, a memory controller 120 determines whether an open memory block exists. When the open memory block exists, in step S1330, the memory controller 120 reads dummy memory cells DMC1 of DMC2 of a dummy word line DWL1 or DWL2 of the open memory block to detect a time after erase. The memory controller 120 programs a nonvolatile memory 110 according to the write request and programs the detected time after erase at the nonvolatile memory 110 as meta data.

When an open memory block does not exist, in step S1340, the memory controller 120 determines whether an erased memory block is opened. If an erased memory block is not opened, the time calculator 128 does not calculate a time after erase separately. For example, when an erased memory block is not opened, as described with reference to FIG. 19, an invalid memory block is erased, and dummy memory cells DMC1 and DMC2 are programmed. Afterwards, the erased memory block may be opened, and a local time of the opened memory block may be measured using the time counter.

When a previously erased memory block is opened, in step S1230, the memory controller 120 reads dummy memory cells DMC1 of DMC2 of a dummy word line DWL1 or DWL2 of the opened memory block to detect a time after erase. The memory controller 120 programs the nonvolatile memory 110 according to the write request and programs the detected time after erase at the nonvolatile memory 110 as meta data.

As described with reference to FIG. 25, the memory controller 120 detects a time after erase whenever a write request is issued.

Figure 26:
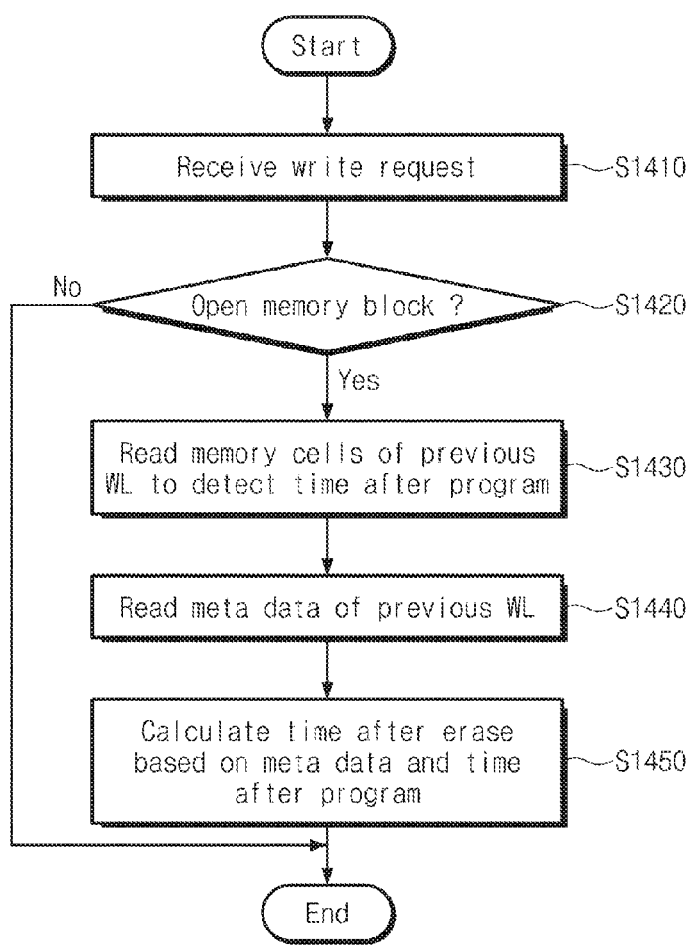

FIG. 26 is a flow chart showing a method (S110) in which a time calculator 128 calculates a time after erase on previously programmed memory cells, according to a further exemplary embodiment of the inventive concept. Referring to FIGS. 1, 3, 4, and 26, in step 1410, a storage device 100 receives a write request.

In step S1420, a memory controller 120 determines whether an open memory block exists. When the open memory block does not exist, a time calculator 128 does not calculate a time after erase separately. When the open memory block exists, the method proceeds to S1430.

In step S1430, the memory controller 120 reads memory cells of a previous word line to detect a time after program. For example, as described with reference to FIGS. 9 and 11, the memory controller 120 may detect a variation in a threshold voltage distribution range of most recently programmed memory cells of the open memory block. The most recently programmed memory cells may not suffer coupling. Unlike a manner described with reference to FIGS. 8 and 10, a variation in a threshold voltage distribution range may be calculated using one scheme.

In step S1440, the memory controller 120 reads meta data on memory cells of the previous word line.

In step S1450, the time calculator 128 calculates a time after erase of the open memory block, based on the meta data and the time after program detected in step S1430.

For example, the time calculator 128 predicts a variation in a threshold voltage distribution range of memory cells of a previous word line due to an erased-after-left effect using meta data and compensates for a time after program detected in step S1430 using the prediction result. The time after program compensated may indicate a time that passes up to now after the memory cells of the previous word line are programmed. The meta data on the memory cells of the previous word line may indicate a time that passes after the memory cells of the previous word line are erased. That is, a time that passes after memory cells to be programmed are erased may be calculated using the meta data and the time after program compensated.

Figure 27:
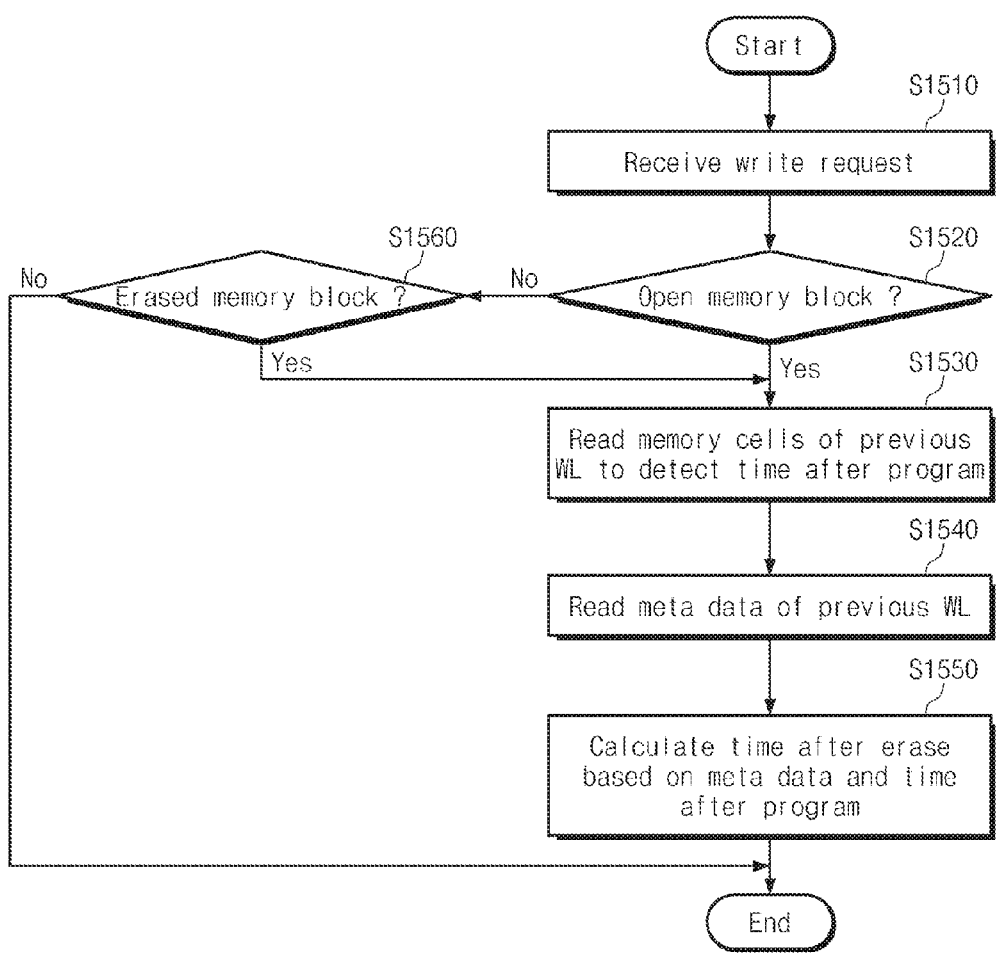

FIG. 27 is a flow chart showing a method (S110) in which a time calculator 128 calculates a time after erase on previously programmed memory cells, according to a further exemplary embodiment of the inventive concept. Referring to FIGS. 1, 3, 17, and 27, in step 1510, a storage device 100 receives a write request.

In step S1520, the memory controller 120 determines whether an open memory block exists. When an open memory block exists, in step S1530, the memory controller 120 reads memory cells of a previous word line to detect a time after program. In step S1540, the memory controller 120 reads meta data on memory cells of the previous word line. In step S1550, a time calculator 128 calculates a time after erase of the open memory block, based on the meta data and the time after program detected in step S1530. Steps S1530 through S1550 are performed substantially the same as those S1430 through S1450 of FIG. 26.

When an open memory block does not exist, in step S1560, the memory controller 120 determines whether an erased memory block is opened. If a previously erased memory block is not opened, the time calculator 128 does not calculate a time after erase separately. For example, when an erased memory block is not opened, as described with reference to FIG. 19, an invalid memory block is erased, and dummy memory cells DMC1 and DMC2 are programmed. Afterwards, the erased memory block may be opened, and a local time of the opened memory block may be measured using the time counter.

When a previously erased memory block is opened or an open memory block exists, in step S1530, the memory controller 120 reads memory cells (e.g., DMC1 of DMC2) of a previous word line (e.g., DWL1 or DWL2) to detect a time after program on the memory cells (e.g., DMC1 of DMC2) of the previous word line (e.g., DWL1 or DWL2). In step S1250, the time calculator 128 restores a local time of the opened memory block, based on the time after erase and a time counter. Step S1540 may be skipped when meta data of the dummy memory cells DMC1 or DMC2 does not exist. In step S1550, the time calculator 128 calculates a time after erase of the open memory block, based on the time after program detected in step S1530. For example, when dummy memory cells DMC1 and DMC2 are programmed just after a memory block is erased, a time after erase of an open memory block may be equal to a time after program on the dummy memory cells DMC1 or DMC2.

Figure 28:
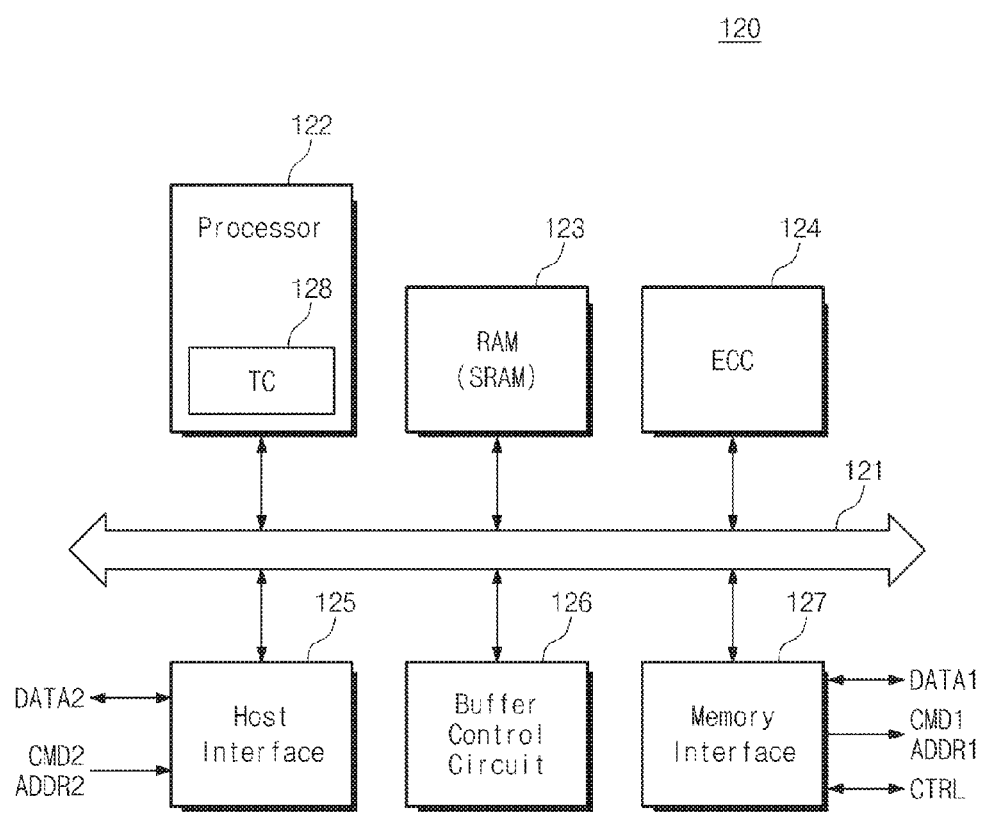
FIG. 28 is a block diagram schematically illustrating a memory controller according to an exemplary embodiment of the inventive concept.

FIG. 28 is a block diagram schematically illustrating a memory controller 120 according to an exemplary embodiment of the inventive concept. Referring to FIG. 28, a memory controller 120 contains a bus 121, a processor 122, a RAM 123, an ECC block 124, a host interface 125, a buffer control circuit 126, and a memory interface 127.

The bus 121 may be configured to provide a channel among components of the memory controller 120.

The processor 122 controls an overall operation of the memory controller 120 and executes a logical operation. The processor 122 communicates with an external host device through the host interface 125. The processor 122 stores, in the RAM 123, a second command CMD2 or a second address ADDR2 received through the host interface 125. The processor 122 produces a first command CMD1 and a first address ADDR1 according to the second command CMD2 or the second address ADDR2 stored in the RAM 123. The processor 122 outputs the first command CMD1 and the first address ADDR1 through the memory interface 127.

The processor 122 outputs the second data DATA2 received from the host interface 125 through the buffer control circuit 126 or stores it in the RAM 123. The processor 122 outputs, through the memory interface 127, data stored in the RAM 123 or data received through the buffer control circuit 126. The processor 122 either stores the first data DATA1 received through the memory interface 127 in the RAM 123 or outputs it through the buffer control circuit 126. Under a control of the processor 122, data stored in the RAM 123 or data received through the buffer control circuit 126 is output through the host interface 125 as the second data DATA2 or is output through the memory interface 127 as the first data DATA1.

The processor 122 includes a time calculator 128 according to an exemplary embodiment of the inventive concept. The time calculator 128 may be implemented in the form of software driven by the processor 122 or in the form of hardware as a part of the processor 122.

The RAM 123 is used as a working memory, a cache memory, or a buffer memory of the processor 122. The RAM 123 stores codes or instructions that the processor 122 will execute. The RAM 123 stores data processed by the processor 122. The RAM 123 may include an SRAM.

The ECC block 124 performs an error correction operation. The ECC block 124 generates parity for error correction, based on first data DATA1 to be output to the memory interface 127 or second data DATA2 received from the host interface 125. The first data DATA1 and parity may be output through the memory interface 127. The ECC block 124 corrects an error of first data DATA1 using the first data DATA1 and parity that are received through the memory interface 127. The ECC block 124 may be implemented as a component of the memory interface 127.

The host interface 125 communicates with the external host device 100 (refer to FIG. 1) under control of the processor 122. The host interface 125 receives the second command CMD2 and the second address ADDR2 from the external host device and exchanges the second data DATA2 with the external host device.

The host interface 125 may communicate using at least one of the following communication manners: USB (Universal Serial Bus), SATA (Serial AT Attachment), HSIC (High Speed Interchip), SCSI (Small Computer System Interface), Firewire, PCI (Peripheral Component Interconnection), PCIe (PCI express), NVMe (NonVolatile Memory express), UFS (Universal Flash Storage), SD (Secure Digital), MMC (MultiMedia Card), and eMMC (embedded MMC).

The buffer control circuit 126 is configured to control a RAM 130 (refer to FIG. 1) under control of the processor 122. The buffer control circuit 126 writes data at the RAM 130 and reads data therefrom.

The memory interface 127 is configured to communicate with a nonvolatile memory 110 (refer to FIG. 1) under control of the processor 122. The memory interface 127 sends a first command CMD1 and a first address ADDR1 to the nonvolatile memory 110 and exchanges first data DATA1 and a control signal CTRL with the nonvolatile memory 110.

In exemplary embodiments, a storage device 100 may be configured not to include the RAM 130. That is, the storage device 100 does not have a separate memory apart from the memory controller 120 and the nonvolatile memory 110. In this case, the memory controller 120 does not include the buffer control circuit 126. A function of the RAM 130 is carried out using the RAM 123 of the memory controller 120.

In exemplary embodiments, the processor 122 controls the memory controller 120 using pieces of code. The processor 122 may load pieces of code from a nonvolatile memory (e.g., read only memory) that is implemented in the memory controller 120. Or, the processor 122 may load pieces of code received from the memory interface 127.

In exemplary embodiments, the bus 121 of the memory controller 120 is divided into a control bus and a data bus. The data bus transfers data in the memory controller 120, and the control bus is configured to transfer the following control information in the memory controller 120: a command and an address. The data bus and the control bus are separated to prevent mutual interference or influence. The data bus is connected with the ECC block 124, the host interface 125, the buffer control circuit 126, and the memory interface 127. The control bus is connected with the processor 122, the RAM 123, the host interface 125, the buffer control circuit 126, and the memory interface 127.

In accordance with exemplary embodiments of the inventive concept, there is measured a time after erase from a point in time when memory cells are erased until a point in time when they are programmed. A variety of compensation algorithms may be applied using the measured time after erase, thereby improving the reliability of a storage device.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An operating method of a storage device which includes a nonvolatile memory having a plurality of memory cells and a memory controller to control the nonvolatile memory, the operating method comprising:

reading previously programmed memory cells among the memory cells of the nonvolatile memory and determining a time after erase of the previously programmed memory cells;

programming selected memory cells among the memory cells of the nonvolatile memory; and programming meta data indicative of a time after erase of the selected memory cells, based on the determined time after erase of the previously programmed memory cells.

2. The operating method of claim 1, wherein the determining of a time after erase includes:

detecting an open memory block including the selected memory cells; and reading first programmed memory cells of the open memory block to determined the time after erase.

3. The operating method of claim 2, wherein the detecting of an open memory block and the reading of first programmed memory cells are performed immediately after detection of a power-on state of the storage device.

4. The operating method of claim 2, wherein the detecting of an open memory block and the reading of first programmed memory cells are performed after detection of a power-on state of the storage device and during an idle state of the storage device.

5. The operating method of claim 2, further comprising: restoring a time passing after erasing the open memory block, based on the determined time after erase and a time counter of the storage device.

6. The operating method of claim 5, wherein the meta data includes a time of the open memory block when the selected memory block is programmed.

7. The operating method of claim 2, wherein the reading of first programmed memory cells includes:

performing a read operation with respect to at least one of program states of the first programmed memory cells;

counting a number of memory cells turned on and a number of memory cells turned off when the read operation is performed; and calculating the time after erase according to the count result.

8. The operating method of claim 7, wherein a method for determining the time after erase is variable according to whether memory cells immediately adjacent to the first programmed memory cells are programmed.

9. The operating method of claim 2, wherein the reading of first programmed memory cells includes:

iteratively performing a read operation with respect to at least one of program states of the first programmed memory cells;

detecting a threshold voltage variation of the at least one program state according to results of the iteratively performed read operations; and determining the time after erase according to the detection result.

10. The operating method of claim 1, further comprising: receiving a write request; and determining whether an open memory block including memory cells before programming exists, and wherein when the open memory block exists, the determining of a time after erase and the programming of meta data are performed according to the write request; and wherein when the open memory block does not exist, erasing of an invalid memory block and programming of memory cells of the erased memory block are performed according to the write request.

11. The operating method of claim 1, wherein a compensation of the time after erase is made according to a difference between a temperature when the previously programmed memory cells are programmed and a temperature when the previously programmed memory cells are read.

12. The operating method of claim 1, further comprising: receiving a read request on the selected memory cells;

reading the meta data of the selected memory cells;

adjusting a read voltage according to the meta data; and reading the selected memory cells using the adjusted read voltage.

13. The operating method of claim 1, wherein the previously programmed memory cells are dummy memory cells.

14. The operating method of claim 13, further comprising: erasing a memory block including the dummy memory cells; and programming the dummy memory cells to a dummy program state immediately after erasing the memory block including the dummy memory cells.

15. The operating method of claim 1, wherein the determining of a time after erase is performed in response to a write request.

16. The operating method of claim 1, wherein the determining of a time after erase includes:

reading meta data of most recently programmed memory cells from an open memory block including the selected memory cells;

reading the most recently programmed memory cells and determining a time after program of the most recently programmed memory cells; and determining the time after erase based on the read meta data and the determined time after program.

17. A storage device comprising:

a nonvolatile memory including a plurality of memory cells; and a memory controller configured to control the nonvolatile memory, wherein the memory controller is further configured to:

read previously programmed memory cells among the memory cells of the nonvolatile memory to detect a time after erase of the previously programmed memory cells;

program selected memory cells among the memory cells of the nonvolatile memory; and program a time after erase of the selected memory cells at the nonvolatile memory based on the time after erase of the previously programmed memory cells.

18. The storage device of claim 17, wherein the previously programmed memory cells are first programmed memory cells of a memory block that includes the previously programmed memory cells and the selected memory cells.

19. The storage device of claim 17, wherein the memory cells are divided into a plurality of strings, wherein the strings are arranged on a substrate in rows and columns; and wherein each of the strings includes at least one ground selection transistor, two or more of the memory cells, and at least one string selection transistor sequentially stacked in a direction perpendicular to the substrate.

20. The storage device of claim 17, wherein the nonvolatile memory comprises a three-dimensional memory array including the plurality of memory cells.

* * * * *